(12) United States Patent
Han et al.

(10) Patent No.: US 11,595,022 B2
(45) Date of Patent: Feb. 28, 2023

(54) BULK-ACOUSTIC WAVE RESONATOR

(71) Applicant: Samsung Electro-Mechanics Co., Ltd., Suwon-si (KR)

(72) Inventors: Won Han, Suwon-si (KR); Sung Wook Kim, Suwon-si (KR); Dae Hun Jeong, Suwon-si (KR); Sang Uk Son, Suwon-si (KR); Sang Heon Han, Suwon-si (KR); Jeong Hoon Ryou, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 282 days.

(21) Appl. No.: 16/898,835

(22) Filed: Jun. 11, 2020

(65) Prior Publication Data

US 2021/0036683 A1  Feb. 4, 2021

(30) Foreign Application Priority Data

Jul. 31, 2019 (KR) .................. 10-2019-0093323
Mar. 13, 2020 (KR) .................. 10-2020-0031588

(51) Int. Cl.
*H03H 9/13* (2006.01)
*H03H 9/25* (2006.01)
*H03H 9/02* (2006.01)

(52) U.S. Cl.
CPC ........ *H03H 9/132* (2013.01); *H03H 9/02015* (2013.01); *H03H 9/25* (2013.01)

(58) Field of Classification Search
CPC ...... H03H 9/132; H03H 9/02015; H03H 9/25; H03H 9/0211; H03H 9/173; H03H 9/02; H03H 9/05; H03H 9/17
See application file for complete search history.

(56) References Cited

U.S. PATENT DOCUMENTS

| 6,215,375 | B1 | 4/2001 | Larson, III et al. |
| 6,914,368 | B2 * | 7/2005 | Nakamura ......... H03H 9/02133 310/365 |
| 2018/0013397 | A1 * | 1/2018 | Lim ................... H03H 9/02118 |
| 2019/0173451 | A1 | 6/2019 | Jaakkola et al. |

FOREIGN PATENT DOCUMENTS

| JP | 5229945 B2 | 7/2013 |
| JP | 2019-9671 A | 1/2019 |
| KR | 10-2019-0024976 A | 3/2019 |

* cited by examiner

*Primary Examiner* — Jeffrey M Shin
(74) *Attorney, Agent, or Firm* — NSIP Law

(57) ABSTRACT

A bulk-acoustic wave resonator includes: a substrate; a lower electrode disposed on the substrate; a piezoelectric layer at least partially covering the lower electrode; and an upper electrode at least partially covering the piezoelectric layer. On a surface of the bulk-acoustic wave resonator, a centroid of an active area in which the lower electrode, the piezoelectric layer, and the upper electrode all overlap each other is aligned with a center of a rectangle defining an aspect ratio of the active area. The active area has a shape of a polygon symmetrical with respect to at least one axis passing through the center of the rectangle defining the aspect ratio. The aspect ratio is greater than or equal to 2 and less than or equal to 10.

21 Claims, 23 Drawing Sheets

II-II'

BULK-ACOUSTIC WAVE RESONATOR

CROSS-REFERENCE TO RELATED APPLICATIONS

This application claims the benefit under 35 U.S.C. § 119(a) of Korean Patent Application Nos. 10-2019-0093323 and 10-2020-0031588 filed on Jul. 31, 2019 and Mar. 13, 2020, respectively, in the Korean Intellectual Property Office, the entire disclosures of which are incorporated herein by reference for all purposes.

BACKGROUND

1. Field

The following description relates to a bulk-acoustic wave resonator.

2. Description of Related Art

A bulk acoustic wave (BAW) filter is, for example, a core component in a front end module such as a smartphone, a desktop PC, or the like. A BAW filter allows a desired frequency band of an RF signal to pass therethrough while blocking a signal in an unwanted frequency band. Demand for BAW filters is increasing with the recent growth in the mobile device market and, in particular, with recent developments in the 5G communications band.

To keep pace with growing market having the 5G communications band into the future, frequencies utilized in the BAW filter should be higher. In this case, since an overall thickness of a resonator should be equal to half of a vertical wave, the overall thickness of the resonator should decrease when a frequency is increased. Accordingly, since thicknesses of a lower electrode and an upper electrode provided in the resonator becomes thin in high frequency applications, heat dissipation properties may be problematic or Q performance at a resonance point may decrease when relatively high power is applied, thereby deteriorating insertion loss (IL) performance of the resonator.

To solve these problems, an aspect ratio of the resonator may increase, and current may be allowed to flow in a uniaxial direction of the resonator. For example, the aspect ratio of a shape of the resonator may increase, and current may be allowed to flow in a uniaxial direction of the resonator, to reduce resistance loss at the resonance point.

However, when the aspect ratio of the resonator is increased, there may be a problem that Q performance is deteriorated.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a substrate; a lower electrode disposed on the substrate; a piezoelectric layer at least partially covering the lower electrode; and an upper electrode at least partially covering the piezoelectric layer. On a surface of the bulk-acoustic wave resonator, a centroid of an active area in which the lower electrode, the piezoelectric layer, and the upper electrode all overlap each other is aligned with a center of a rectangle defining an aspect ratio of the active area. The active area has a shape of a polygon symmetrical with respect to at least one axis passing through the center of the rectangle defining the aspect ratio. The aspect ratio is greater than or equal to 2 and less than or equal to 10.

The rectangle defining the aspect ratio may be a rectangle having a largest aspect ratio among rectangles contacting three or more vertices of the polygon.

The polygon may be a polygon having N angles, wherein N is an even number greater than or equal to 4.

The bulk-acoustic wave resonator may further include a membrane layer forming a cavity together with the substrate.

The bulk-acoustic wave resonator may further include an etch-preventing portion disposed to surround the cavity.

The bulk-acoustic wave resonator may further include a sacrificial layer disposed outside of the etch-preventing portion.

The bulk-acoustic wave resonator may further include an insertion layer at least partially disposed between the lower electrode and the piezoelectric layer.

The bulk-acoustic wave resonator may further include a passivation layer disposed to expose a portion of the lower electrode and a portion of the upper electrode.

The bulk-acoustic wave resonator may further include a metal pad contacting the exposed portion of the lower electrode and the exposed portion of the upper electrode.

In another general aspect, a bulk-acoustic wave resonator includes: a substrate; a lower electrode disposed on the substrate; a piezoelectric layer at least partially covering the lower electrode; and an upper electrode at least partially covering the piezoelectric layer. A centroid of an active area in which the lower electrode, the piezoelectric layer, and the upper electrode all overlap each other matches an first axis coordinate value of a center of a rectangle defining an aspect ratio of the active area, and the centroid of the active area mismatches a second axis coordinate value of the center of the rectangle defining the aspect ratio of the active area. The first axis coordinate value is a coordinate value with respect to a first axis of the rectangle defining the aspect ratio, and the second axis coordinate value is a coordinate value with respect to a second axis of the rectangle defining the aspect ratio. The bulk-acoustic wave resonator satisfies y'/h<0.067, y' being a separation distance between the centroid of the active area and the center of the rectangle in a direction of the second axis, and h being a length of the active area in the direction of the second axis.

The active area may be symmetrical with respect to the first axis.

The rectangle defining the aspect ratio may be a rectangle having a largest aspect ratio among rectangles contacting three or more vertices of a perimeter shape of the active area.

The bulk-acoustic wave resonator may further include an insertion layer partially disposed between the lower electrode and the piezoelectric layer.

The insertion layer may have a ring shape.

In another general aspect, a bulk-acoustic wave resonator includes: a lower electrode disposed on a substrate; a piezoelectric layer disposed on the lower electrode; and an upper electrode disposed on the piezoelectric layer. A perimeter of an active area in which the lower electrode, the piezoelectric layer, and the upper electrode all overlap each other has a shape of a polygon symmetrical with respect to at least one axis passing through a center of a rectangle defining an aspect ratio of the polygon. A centroid of the polygon is aligned with the center of the rectangle defining the aspect ratio. The aspect ratio is greater than or equal to 2 and less than or equal to 10.

The at least one axis may include only one axis.

The polygon may be either one of a rhombus, a hexagon, and an octagon.

The aspect ratio may be greater than or equal to 2.4 and less than or equal to 5.6.

The rectangle defining the aspect ratio may be a rectangle having a largest aspect ratio among rectangles contacting three or more vertices of the polygon.

In another general aspect, a bulk-acoustic wave resonator includes: a lower electrode disposed on a substrate; a piezoelectric layer disposed on the lower electrode; and an upper electrode disposed on the piezoelectric layer. An active area in which the lower electrode, the piezoelectric layer, and the upper electrode all overlap each other has a shape of a polygon. A centroid of the polygon matches a first axis coordinate value of a center of a rectangle defining an aspect ratio of the polygon, and the centroid of the active area mismatches a second axis coordinate value of the center of the rectangle defining the aspect ratio of the polygon. The first axis coordinate value is a coordinate value with respect to a first axis of the rectangle defining the aspect ratio, and the second axis coordinate value is a coordinate value with respect to a second axis of the rectangle defining the aspect ratio. The bulk-acoustic wave resonator satisfies $y'/h<0.067$, $y'$ being a separation distance between the centroid of the active area and the center of the rectangle in a direction of the second axis, and h being a length of the active area in the direction of the second axis.

The active area may be symmetrical with respect to the first axis.

The polygon may be a hexagon.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
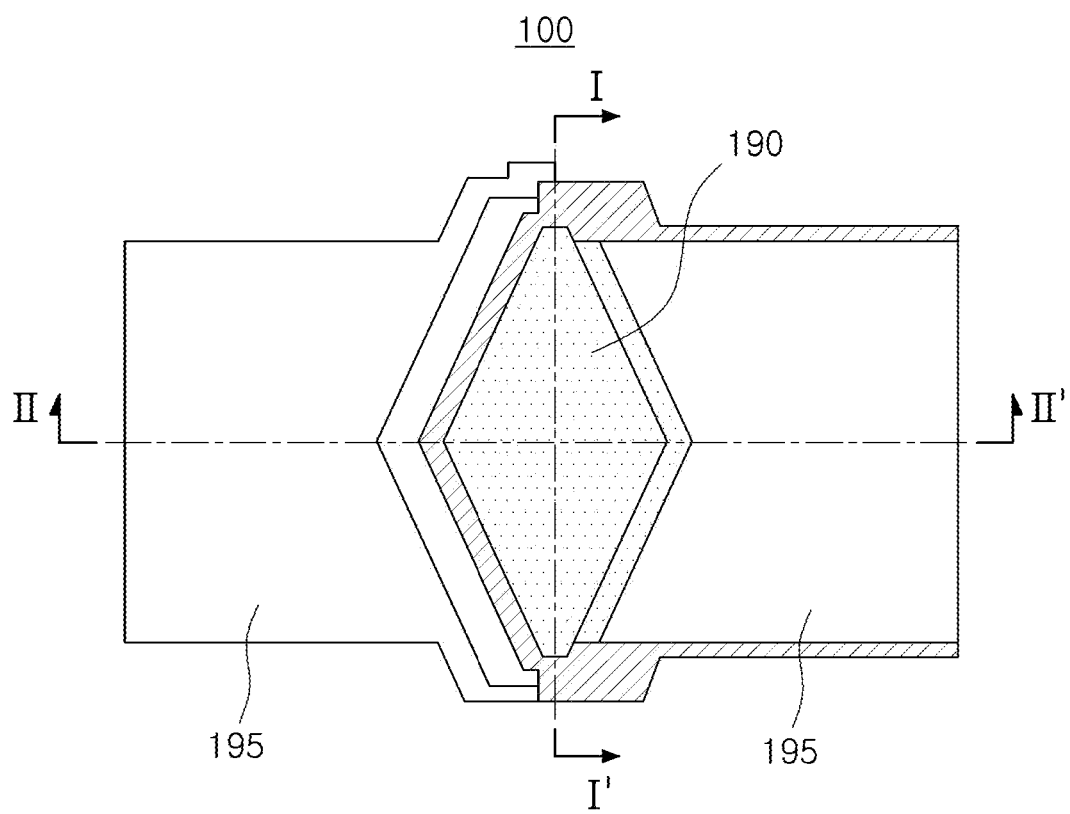
FIG. 1 is a schematic plan view illustrating a bulk-acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," "front," "rear," and "side" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. For another example, if the device in the figures is turned around, an element described as being "front" relative to another element will then be "rear" relative to the other element. Thus, the term "front" encompasses both the front and rear orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
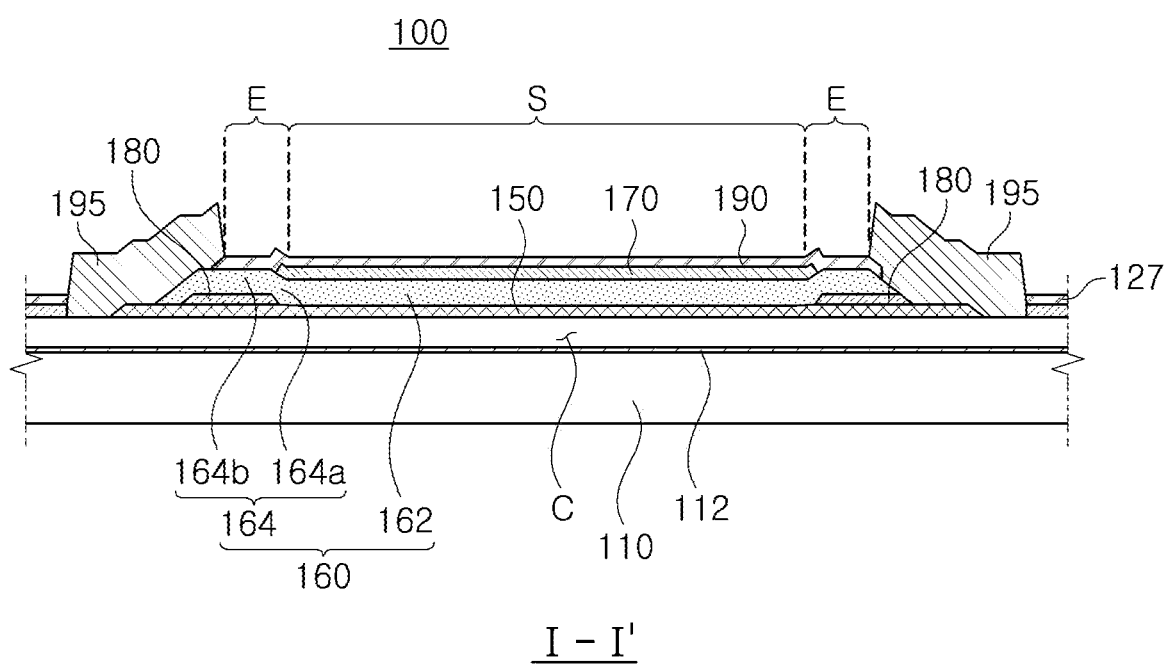
FIG. 2 is a cross-sectional view taken along line I-I' of FIG. 1.
Figure 3:
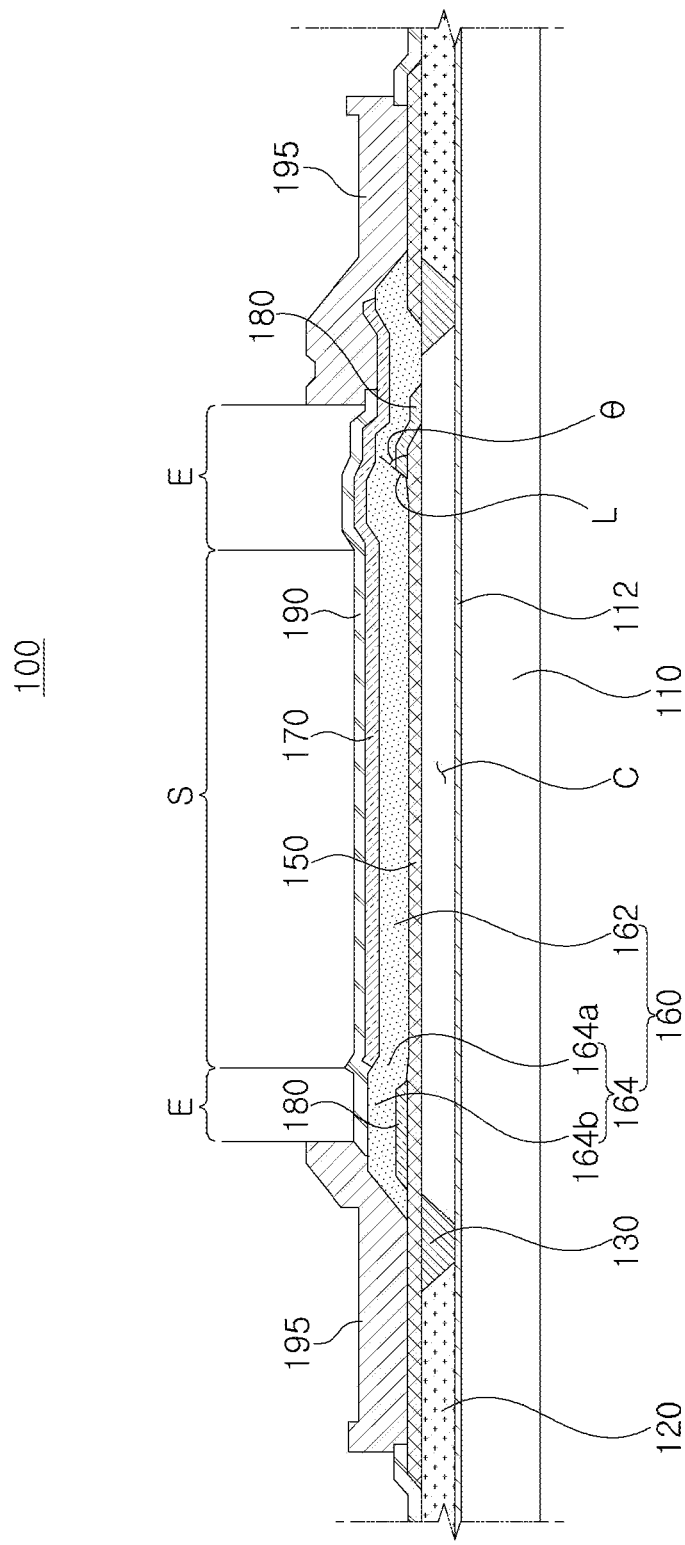
FIG. 3 is a cross-sectional view taken along line II-II' of FIG. 1.

FIG. 1 is a schematic plan view illustrating a bulk-acoustic wave resonator 100, according to an embodiment. FIG. 2 is a cross-sectional view taken along line I-I' of FIG. 1. FIG. 3 is a cross-sectional view taken along line II-II' of FIG. 1.

Referring to FIGS. 1 to 3, the bulk-acoustic wave resonator 100 may, for example include a substrate 110, a sacrificial layer 120, an etch-preventing portion 130, a lower electrode 150, a piezoelectric layer 160, an upper electrode 170, an insertion layer 180, a passivation layer 190, and a metal pad 195.

The substrate 110 may be a silicon substrate. For example, the substrate 110 may be a silicon wafer or a silicon-on-insulator (SOI) type substrate.

An insulating layer 112 may be formed on an upper surface of the substrate 110, and may electrically isolate the substrate 110 from a structure disposed thereon. In addition, the insulating layer 112 may prevent the substrate 110 from being etched by an etching gas, when a cavity C is formed in a manufacturing process.

In this example, the insulating layer 112 may be formed of any one or any combination of any two of more of silicon dioxide ($SiO_2$), silicon nitride ($Si_3N_4$), aluminum oxide ($Al_2O_3$), and aluminum nitride (AlN). The insulating layer 112 may be formed on the substrate 110 by any one of a chemical vapor deposition process, an RF magnetron sputtering process, and an evaporation process.

The sacrificial layer 120 may be formed on the insulating layer 112, and the cavity C and the etch-preventing portion 130 may be disposed in the sacrificial layer 120. For example, the cavity C may be formed by removing a portion of the sacrificial layer 120 in the manufacturing process. Thus, because the cavity C is formed in the sacrificial layer 120, the lower electrode 150 and the other layers arranged on the sacrificial layer 120 may be formed to be planar or substantially planar.

The etch-prevention portion 130 may be disposed along a boundary of the cavity C. The etch-prevention portion 130 may prevent etching from proceeding beyond an area of the cavity in an operation of forming the cavity C.

A portion of the lower electrode 150 may be disposed on an upper portion of the cavity C. Further, the lower electrode 150 may be configured as either an input electrode or an output electrode for inputting or outputting, respectively, an electrical signal such as a radio frequency (RF) signal or the like.

For example, the lower electrode 150 may be formed of a conductive material such as molybdenum (Mo), or an alloy of Mo. However, the lower electrode is not limited to being formed of Mo, and may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy of Ru, W, Ir, Pt, Cu, Ti, Ta, Ni, or Cr.

The piezoelectric layer 160 may be formed to at least partially cover a portion of the lower electrode 150 disposed on the upper portion of the cavity C. The piezoelectric layer 160 may be a layer that generates a piezoelectric effect that converts electrical energy into mechanical energy in the form of elastic waves, and may be formed of any one of aluminum nitride (AlN), zinc oxide (ZnO), or lead zirconium titanium oxide (PZT; PbZrTiO). For example, when the piezoelectric layer 160 is formed of aluminum nitride (AlN), the piezoelectric layer 160 may further include a rare earth metal. For example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). In addition, magnesium (Mg), which is a divalent metal, may also be included.

The piezoelectric layer 160 may include a piezoelectric portion 162 disposed in a planar section S generally located in a central region of the piezoelectric layer 160, and a bent portion 164 disposed in an extension section E disposed outside of the planar section S.

The piezoelectric portion 162 may be a portion directly stacked on an upper surface of the lower electrode 150. Therefore, the piezoelectric portion 162 may be interposed between the lower electrode 150 and the upper electrode 170 to form a planar shape, together with the lower electrode 150 and the upper electrode 170.

The bent portion 164 may be a portion extending outwardly from the piezoelectric portion 162 and located in the extension section E.

The bent portion 164 may be disposed on the insertion layer 180, which will be described later, and may be formed to have a shape raised according to a shape of the insertion layer 180. Therefore, the piezoelectric layer 160 may be bent at a boundary between the piezoelectric portion 162 and the bent portion 164, and the bent portion 164 may be raised corresponding to a thickness and a shape of the insertion layer 180.

The bent portion 164 may include an inclined portion 164a and an extended portion 164b.

The inclined portion 164a is, for example, a portion formed to be inclined along an inclined surface L of the insertion layer 180 to be described later. In addition, the extended portion 164b is, for example, a portion extending outwardly from the inclined portion 164a.

The inclined portion 164a may be formed parallel to the inclined surface L of the insertion layer 180, and an angle of incline of the inclined portion 164a may be formed to be the same as an angle of incline θ of the inclined surface L of the insertion layer 180.

The upper electrode 170 may be formed to at least partially cover the portion of the piezoelectric layer 160 disposed on the upper portion of the cavity C. The upper electrode 170 may be configured as either the input electrode or the output electrode for inputting or outputting, respectively, an electrical signal such as a radio frequency (RF) signal or the like. For example, when the lower electrode 150 is configured as the input electrode, the upper electrode 170 may be configured as the output electrode, and when the lower electrode 150 is configured as the output electrode, the upper electrode 170 may be configured as the input electrode.

The upper electrode 170 may be formed of a conductive material such as molybdenum (Mo) or an alloy of Mo, as an example. However, the upper electrode is not limited to being formed of Mo, and the upper electrode 170 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy of Ru, W, Ir, Pt, Cu, Ti, Ta, Ni, or Cr.

The active area is, for example, an area in which the lower electrode 150, the piezoelectric layer 160, and the upper electrode 170 all overlap.

As illustrated in FIG. 1, on an upper surface of the bulk-acoustic wave resonator 100 (e.g. in a top plan view), a centroid of the active area may match a center of a rectangle defining an aspect ratio of the active area, and the active area may have a shape of a polygon symmetrical with respect to at least one axis passing through the center of the rectangle defining the aspect ratio. Herein, descriptions of a shape of an active area describe an overall planar shape of the active area, or a planar shape of a perimeter of the active area, on the upper surface of the resonator.

In this example, a definition of an aspect ratio and a definition of a rectangle defining the aspect ratio will be described in more detail.

Figures 4, 5:
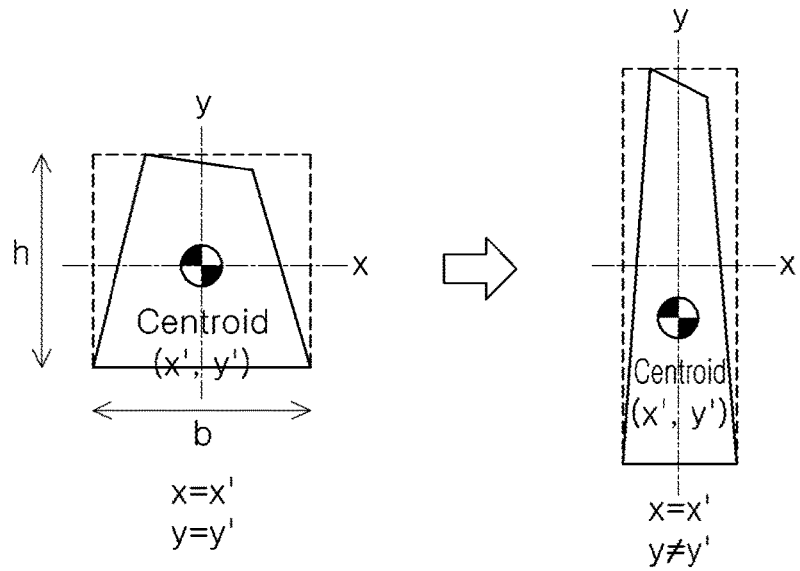
FIG. 4 is an example explanatory diagram illustrating an aspect ratio and a centroid of an asymmetric polygon.
FIG. 5 is an example explanatory diagram illustrating a rectangle defining an aspect ratio of an asymmetric polygon.

FIG. 4 is an example explanatory diagram illustrating an aspect ratio and a centroid of an asymmetric polygon.

Referring to FIG. 4, an aspect ratio in a polygon may be defined as a ratio of a short axis and a long axis of a rectangle contacting three or more vertices of the polygon. For example, the aspect ratio (AR)=h/b.

For example, in a case of an asymmetric polygon, as illustrated in FIG. 4, a rectangle contacting three vertices may be drawn. As illustrated in FIG. 4, when the aspect ratio is close to 1, centers (x, y) of the rectangle contacting the polygon may almost match centroids (x', y') of the polygon, but as the aspect ratio increases, the center (x, y) of the rectangle may increasingly mismatch the centroid (x', y') of the polygon.

FIG. 5 is an example explanatory diagram illustrating a rectangle defining an aspect ratio of an asymmetric polygon.

As illustrated in FIG. 5, a rectangle contacting three or more vertices of an asymmetric polygon may be illustrated as various types of rectangles depending on a rotation angle of the same polygon. A rectangle defining an aspect ratio will be defined as a rectangle having the largest aspect ratio, among the various types of rectangles illustrated in FIG. 5. For example, a rectangle contacting a polygon at a rotation angle of 0° may be defined as the rectangle defining the aspect ratio.

Figure 6:
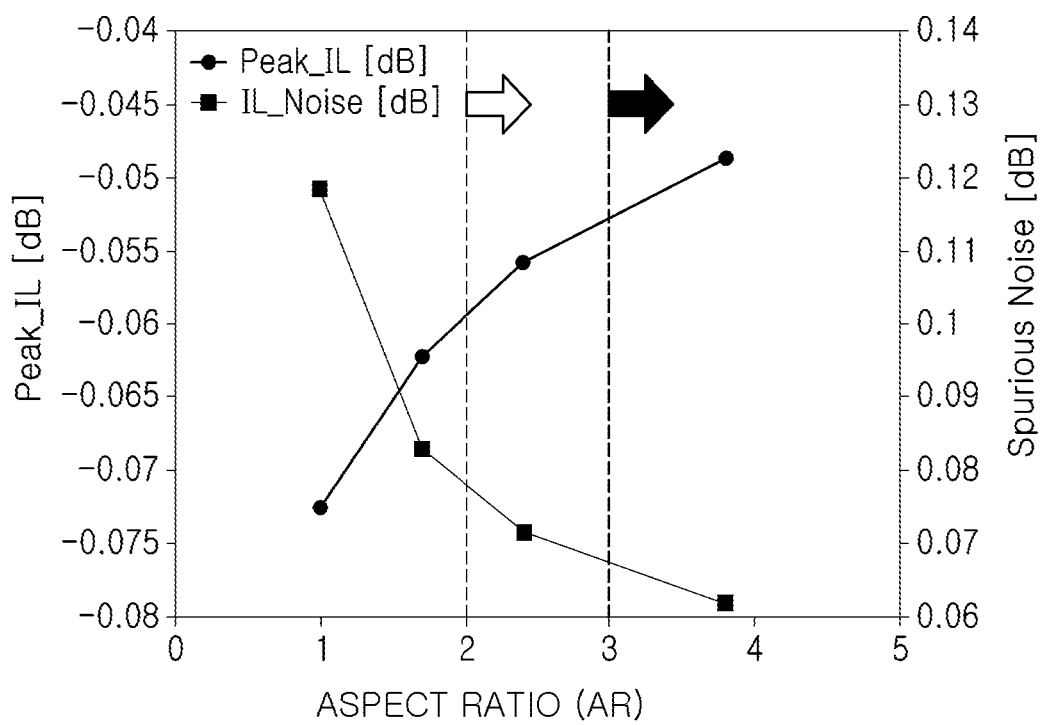
FIG. 6 is a graph illustrating performance of a bulk-acoustic wave resonator depending on an aspect ratio, according to an example.

According to an example, the aspect ratio may, for example, be greater than or equal to 2 and less than or equal to 10. For example, as illustrated in FIG. 6, it can be understood that peak insertion loss (Peak_IL) is improved as an aspect ratio (AR) increases, and spurious noise is also improved as the aspect ratio (AR) increases.

For example, as the aspect ratio (AR) increases, resistance loss at a resonance point may decrease. For example, it can be understood that when the aspect ratio is greater than 2, the peak insertion loss (Peak_IL) is improved to about −0.06 dB, and when the aspect ratio is greater than 3, the peak insertion loss (Peak_IL) is improved to about −0.05 dB.

In addition, as the aspect ratio (AR) increases, overlap of a harmonic mode by a resonance mode, reflected from each side, may decrease, to improve the spurious noise. For example, it can be understood that when the aspect ratio is greater than 2, the spurious noise may be less than 0.08 dB, and when the aspect ratio is greater than 3, the spurious noise may be less than 0.07 dB.

As an example, when the active area has a shape of a rhombus, and the aspect ratio (AR) of the active area is 10 or more, an included angle in the rhombus may become very narrow. That is, at least one angle between sides having a common vertex in the rhombus may be very narrow. In this case, the overlap of the harmonics mode may increase or the resonance itself may not be smoothly driven.

Referring to FIGS. 2 and 3 again, the insertion layer 180 may be disposed between the lower electrode 150 and the piezoelectric layer 160. The insertion layer 180 may be formed of a dielectric material such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenic (GaAs), hafnium oxide ($HfO_2$), titanium oxide ($TiO_2$), zinc oxide (ZnO), or the like, but may be formed of a material from the material of the piezoelectric layer 160.

In addition, at least a portion of the insertion layer 180 may be disposed between the piezoelectric layer 160 and the lower electrode 150. As an example, the insertion layer 180 may have a ring shape.

The passivation layer 190 may be formed in areas excluding portions of the lower electrode 150 and the upper electrode 170. The passivation layer 190 may prevent damage to the upper electrode 170 and the lower electrode 150 during operation of the bulk acoustic wave resonator 100.

As an example, the passivation layer 190 may be formed of a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO).

The metal pad 195 may be formed on the lower electrode 150, and on a portion of the upper electrode 170 on which the passivation layer 190 is not formed. As an example, the metal pad 195 may be made of a material such as gold (Au), gold-tin (Au—Sn) alloy, copper (Cu), copper-tin (Cu—Sn) alloy, aluminum (Al), aluminum alloy, or the like. For example, the aluminum alloy may be an aluminum-germanium (Al—Ge) alloy.

As described above, since the active area has a shape of an axisymmetric rhombus, it is possible to improve Q performance during resonance driving. In addition, since the active area has an axisymmetric shape, spurious noise may be reduced.

Figure 7:
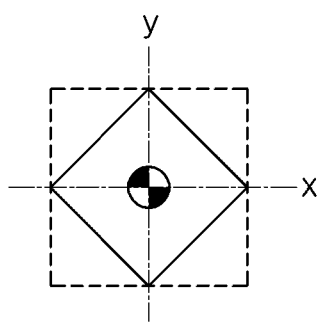
FIG. 7 is a schematic plan view illustrating an example in which an active area of a bulk-acoustic wave resonator has a shape of an axisymmetric rhombus and an aspect ratio of 1.
Figure 8:
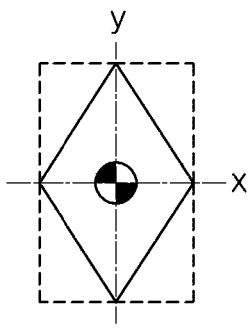
FIG. 8 is a schematic plan view illustrating an example in which an active area of a bulk-acoustic wave resonator has a shape of an axisymmetric rhombus and an aspect ratio of 1.5.
Figure 9:
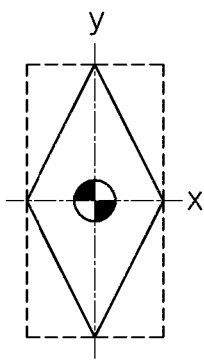
FIG. 9 is a schematic plan view illustrating an example in which an active area of a bulk-acoustic wave resonator has a shape of an axisymmetric rhombus and an aspect ratio of 2.0.
Figure 10:
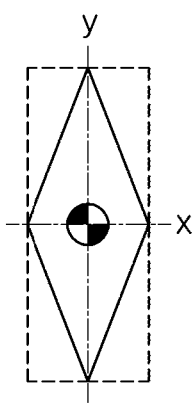
FIG. 10 is a schematic plan view illustrating an example in which an active area of a bulk-acoustic wave resonator has a shape of an axisymmetric rhombus and an aspect ratio of 2.5.
Figure 11:
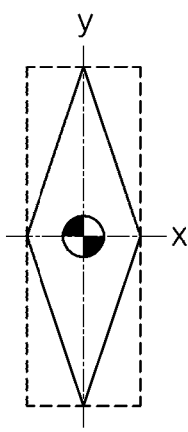
FIG. 11 is a schematic plan view illustrating an example in which an active area of a bulk-acoustic wave resonator has a shape of an axisymmetric rhombus and an aspect ratio of 3.0.
Figure 12:
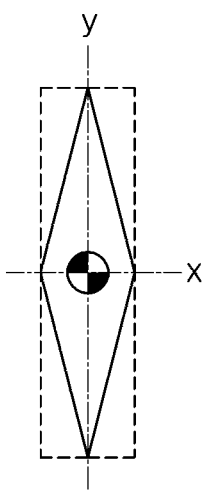
FIG. 12 is a schematic plan view illustrating an example in which an active area of a bulk-acoustic wave resonator has a shape of an axisymmetric rhombus and an aspect ratio of 3.5.

FIG. 7 is a schematic plan view illustrating an example in which an active area of a bulk-acoustic resonator (hereinafter, "resonator") has a shape of an axisymmetric rhombus and an aspect ratio of 1 FIG. 8 is a schematic plan view illustrating an example in which an active area of a resonator has a shape of an axisymmetric rhombus and an aspect ratio of 1.5. FIG. 9 is a schematic plan view illustrating an example in which an active area of a resonator has a shape of an axisymmetric rhombus and an aspect ratio of 2.0. FIG. 10 is a schematic plan view illustrating an example in which an active area of a resonator has a shape of an axisymmetric rhombus and an aspect ratio of 2.5. FIG. 11 is a schematic plan view illustrating an example in which an active area of a resonator has a shape of an axisymmetric rhombus and an aspect ratio of 3.0. FIG. 12 is a schematic plan view illustrating an example in which an active area of a resonator has a shape of an axisymmetric rhombus and an aspect ratio of 3.5.

As illustrated in FIGS. 7 to 12, it can be seen that when an active area of the resonator has a shape of rhombus on an upper surface of the resonator (e.g. in a top plan view), a centroid of the rhombus matches a center of a rectangle defining an aspect ratio of the rhombus/active area.

Figure 13:
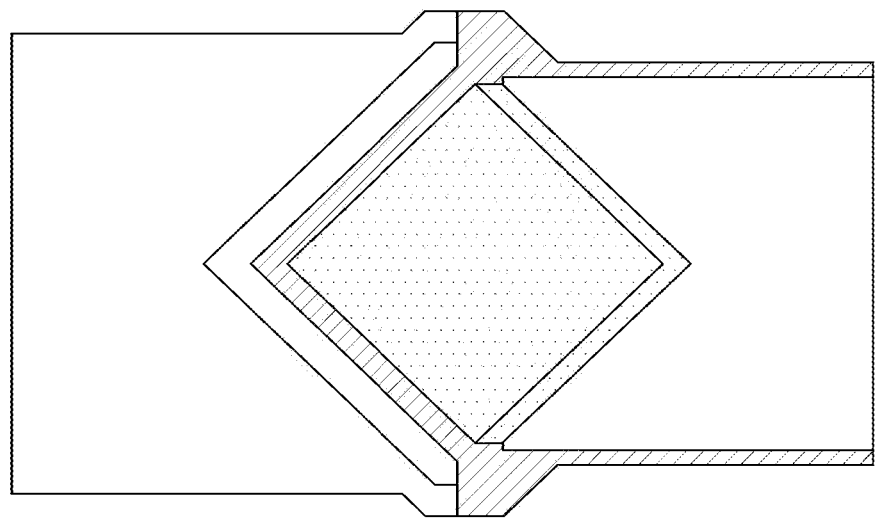
FIGS. 13 to 15 are schematic plan views illustrating bulk-acoustic wave resonators in which an active area of the resonator has a shape of an axisymmetric rhombus, according to examples.
Figure 14:
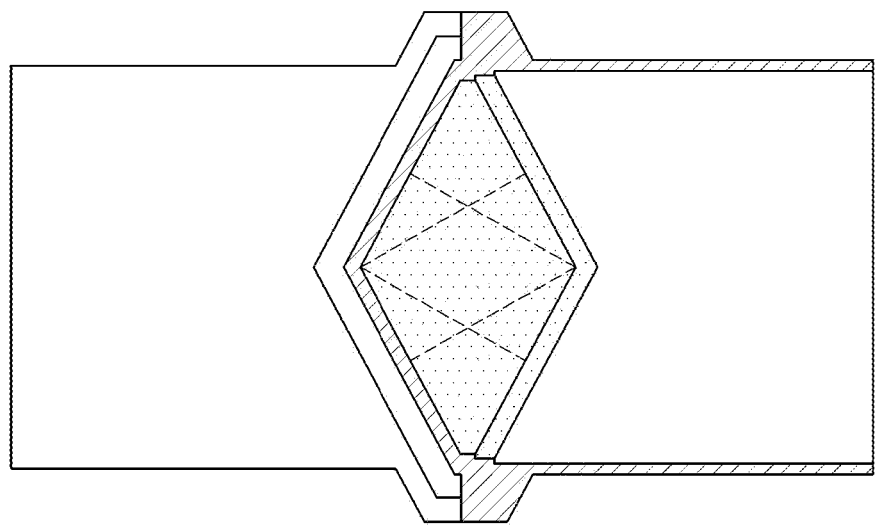
Figure 15:
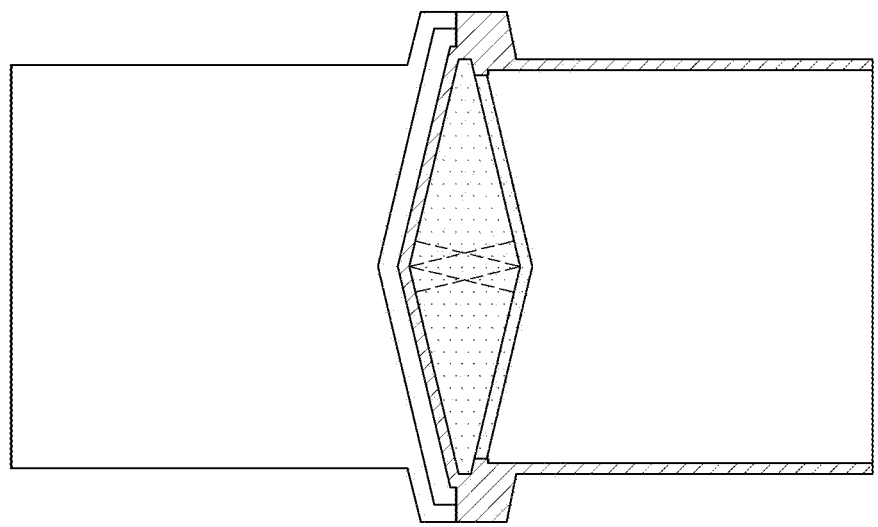

FIGS. 13 to 15 are schematic plan views illustrating resonators in which an active area of the resonator has a shape of an axisymmetric rhombus, according to examples.

In the following description, references to an included angle of a rhombus describe a smallest included angle among included angles of the rhombus.

A resonator (AR 1.0) illustrated in FIG. 13 is an example in which an included angle θ of a rhombus is 90° and an aspect ratio of the rhombus is 1. In this case, an overlapping area of normal vectors on each side (OA, where O is a center of the rhombus and A is a vertex of the rhombus) may be equal to (100% of) the total area of the rhombus.

In addition, a resonator (AR 1.7) illustrated in FIG. 14 is an example in which an included angle θ of a rhombus is 60° and an aspect ratio of the rhombus is 1.7. In this case, an overlapping area of normal vectors on each side (OA) may be 50% of the total area of the rhombus.

In addition, a resonator (AR 3.8) illustrated in FIG. 15 is an example in which an included angle θ of a rhombus is 26° and an aspect ratio of the rhombus is 3.8. In this case, an overlapping area of normal vectors on each side (OA) may be 12% of the total area of the rhombus.

Figure 16:
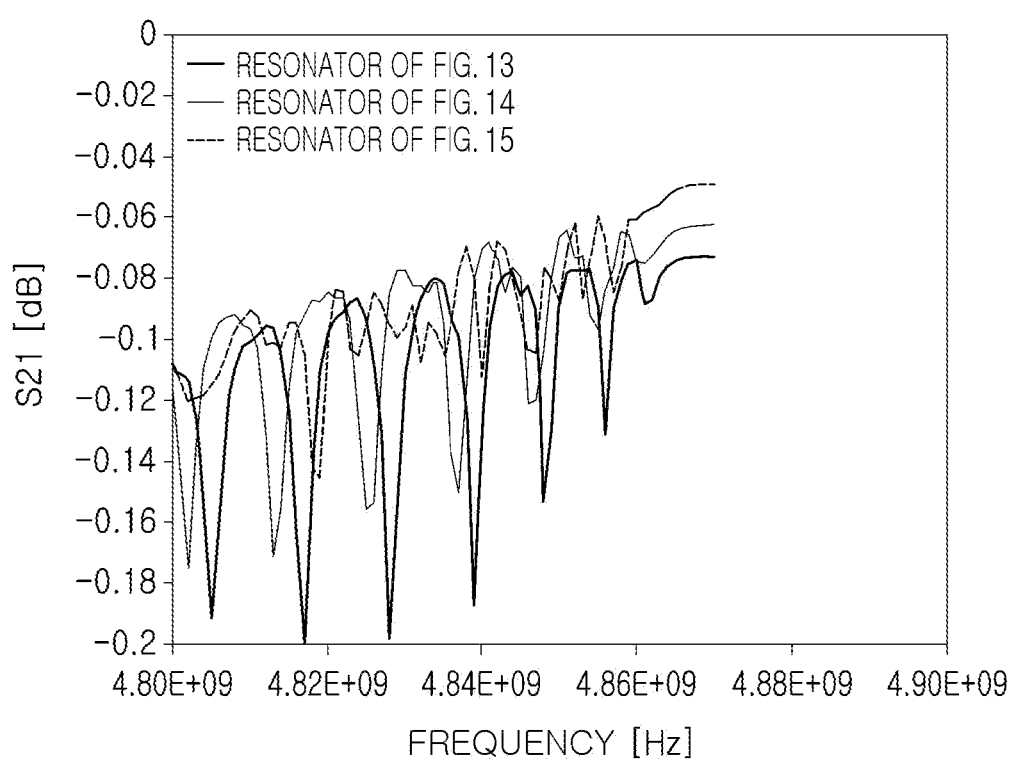
FIG. 16 is a graph of S21 depending on a frequency, illustrating spurious noise of the bulk-acoustic wave resonators of FIGS. 13 to 15, according to examples.

As illustrated in FIG. 16, spurious noise of the resonator may be the largest in the example of AR 1.0, may be smaller than the case of AR 1.0 in the example of AR 1.7, and may be the smallest in the example of AR 3.8.

Spurious noise changes depending on the aspect ratio in active areas having shapes of rhombus because the aspect ratio affects the amount of overlap of a harmonic mode by a resonance mode. For example, in a case in which opposite sides of a rhombus having an aspect ratio close to 1.0 are arranged in parallel, 100% overlap of a harmonic mode by a resonance mode reflected from each side may occur, and spurious noise may increase.

As the aspect ratio increases, the opposing sides of the rhombus may be arranged in parallel, but a size of an overlapping area of normal vectors on each side (OA) may decrease relatively. In this case, overlap of a harmonic mode by a resonance mode reflected from each side may be reduced. As a result, in a case of an axisymmetric polygonal structure having a relatively large aspect ratio, spurious noise may be reduced by this principle.

Figure 17:
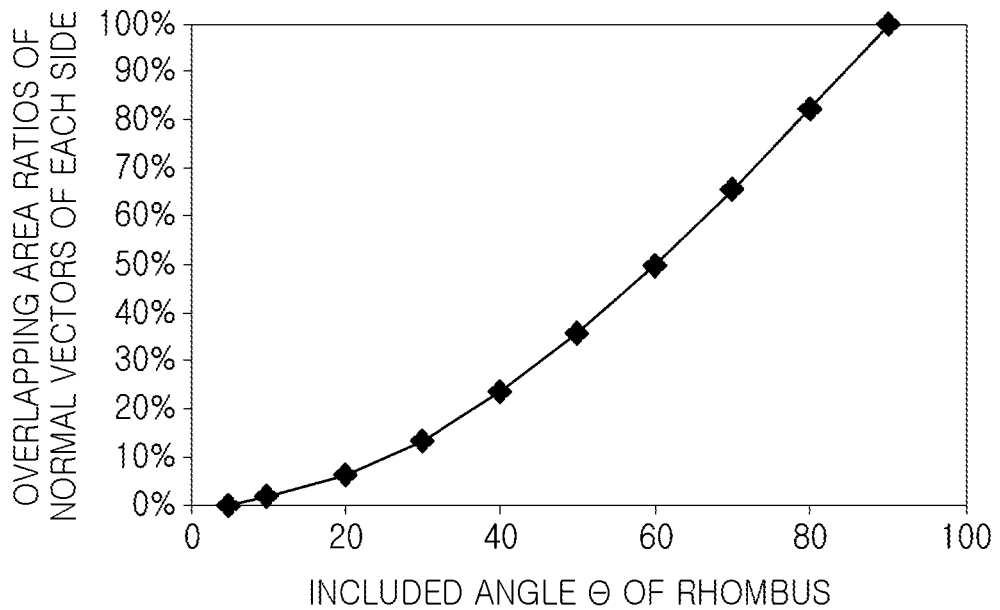
FIG. 17 is a graph illustrating overlapping area ratios of normal vectors of each side depending on an included angle between axisymmetric rhombuses, according to an example.

For example, since a length of each side may be the same in the axisymmetric rhombus, as illustrated in FIG. 17, it can be seen that overlapping area ratios of normal vectors of each side may be changed depending on a value of an included angle θ of the rhombus. In addition, to reduce spurious noise, an included angle θ of the rhombus may be 30° or less.

When an included angle θ of the rhombus is 30°, overlapping area ratios of normal vectors of each side may be 13.4%, and, in this case, an aspect ratio of the axisymmetric rhombus may be 3.7.

Table 1 below shows example performance characteristics of the resonators of FIGS. 13 to 15.

TABLE 1

| AR | Included Angle (°) | fs (GHz) | fp (GHz) | kt² [%] | IL [dB] | Attn. [dB] |
|---|---|---|---|---|---|---|
| 1.0 | 90 | 4.8630 | 5.1320 | 12.28 | −0.073 | −31.9 |
| 1.7 | 60 | 4.8630 | 5.1320 | 12.28 | −0.062 | −31.9 |
| 3.8 | 26 | 4.8620 | 5.1270 | 12.12 | −0.049 | −29.7 |

In the case of the resonator illustrated in FIG. 13 having an aspect ratio of 3.8, among the resonators illustrated in FIGS. 13 to 15, it can be understood that insertion loss performance at a resonance point may be significantly improved as illustrated in Table 1 above. This shows that the resistance loss at the resonance point is relatively small. In this example, "IL" refers to a maximum value of magnitude S21 at a resonance point, and "Attn." refers to a minimum value of magnitude S21 at an anti-resonance point.

Figure 18:
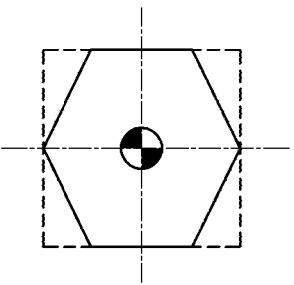
FIG. 18 is a schematic plan view illustrating an example in which an active area of a bulk-acoustic wave resonator has a shape of an axisymmetric hexagon and an aspect ratio of 1.
Figure 19:
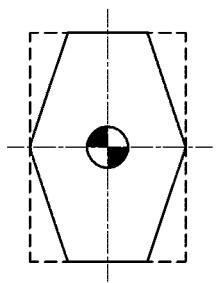
FIG. 19 is a schematic plan view illustrating an example in which an active area of a bulk-acoustic wave resonator has a shape of an axisymmetric hexagon and an aspect ratio of 1.5.
Figure 20:
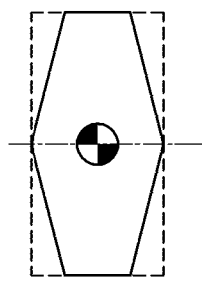
FIG. 20 is a schematic plan view illustrating an example in which an active area of a bulk-acoustic wave resonator has a shape of an axisymmetric hexagon and an aspect ratio of 2.0.
Figure 21:
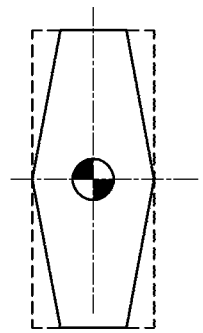
FIG. 21 is a schematic plan view illustrating an example in which an active area of a bulk-acoustic wave resonator has a shape of an axisymmetric hexagon and an aspect ratio of 2.5.
Figure 22:
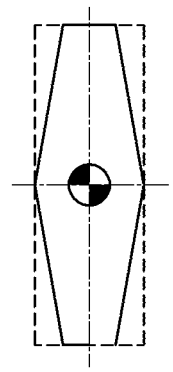
FIG. 22 is a schematic plan view illustrating an example in which an active area of a bulk-acoustic wave resonator has a shape of an axisymmetric hexagon and an aspect ratio of 3.0.
Figure 23:
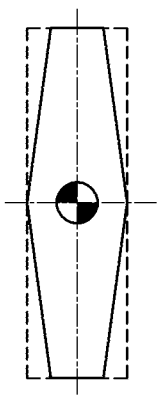
FIG. 23 is a schematic plan view illustrating an example in which an active area of a bulk-acoustic wave resonator has a shape of an axisymmetric hexagon and an aspect ratio of 3.5.

FIG. 18 is a schematic plan view illustrating an example in which an active area of a resonator has a shape of an axisymmetric hexagon and an aspect ratio of 1. FIG. 19 is a schematic plan view illustrating an example in which an active area of a resonator has a shape of an axisymmetric hexagon and an aspect ratio of 1.5. FIG. 20 is a schematic plan view illustrating an example in which an active area of a resonator has a shape of an axisymmetric hexagon and an aspect ratio of 2.0. FIG. 21 is a schematic plan view illustrating an example in which an active area of a resonator has a shape of an axisymmetric hexagon and an aspect ratio of 2.5. FIG. 22 is a schematic plan view illustrating an example in which an active area of a resonator has a shape of an axisymmetric hexagon and an aspect ratio of 3.0. FIG. 23 is a schematic plan view illustrating an example in which an active area of a resonator has a shape of an axisymmetric hexagon and an aspect ratio of 3.5.

As illustrated in FIGS. 18 to 23, it can be seen that when an active area of the resonator has a shape of a hexagon on an upper surface of the resonator (e.g. in a top plan view), a centroid of the hexagon matches a center of a rectangle defining an aspect ratio of the hexagon/active area.

As described above, even when the axisymmetric hexagon has a relatively high aspect ratio, symmetry may be maintained to improve Q performance during resonance driving. In addition, in the hexagon having a relatively high aspect ratio, since design variables may be added due to an addition of upper and lower sides of the hexagon, design freedom may be increased to further reduce the resonance point resistance. In this case, the upper and lower sides of the hexagon may be parallel to each other, but when a hexagon having a relatively high aspect ratio is formed, a distance between the upper and lower sides of the hexagon may be longer to reduce an influence of the upper and lower sides on each other, to suppress deterioration of spurious noise performance.

Figure 24:
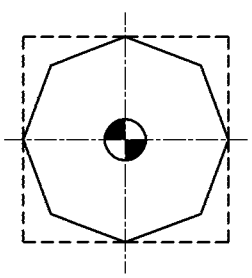
FIG. 24 is a schematic plan view illustrating an example in which an active area of a bulk-acoustic wave resonator has a shape of an axisymmetric octagon and an aspect ratio of 1.
Figure 25:
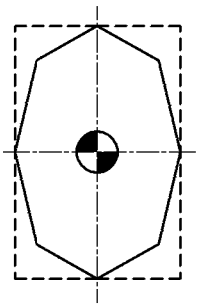
FIG. 25 is a schematic plan view illustrating an example in which an active area of a bulk-acoustic wave resonator has a shape of an axisymmetric octagon and an aspect ratio of 1.5.
Figure 26:
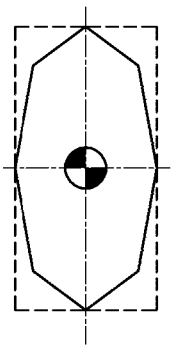
FIG. 26 is a schematic plan view illustrating an example in which an active area of a bulk-acoustic wave resonator has a shape of an axisymmetric octagon and an aspect ratio of 2.0.
Figure 27:
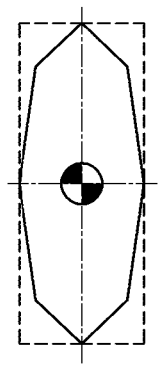
FIG. 27 is a schematic plan view illustrating an example in which an active area of a bulk-acoustic wave resonator has a shape of an axisymmetric octagon and an aspect ratio of 2.5.
Figure 28:
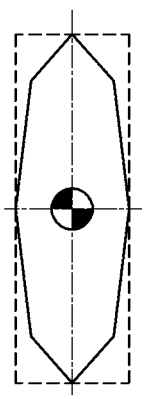
FIG. 28 is a schematic plan view illustrating an example in which an active area of a bulk-acoustic wave resonator has a shape of an axisymmetric octagon and an aspect ratio of 3.
Figure 29:
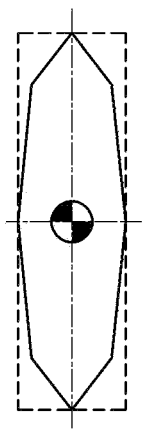
FIG. 29 is a schematic plan view illustrating an example in which an active area of a bulk-acoustic wave resonator has a shape of an axisymmetric octagon and an aspect ratio of 3.5.

FIG. 24 is a schematic plan view illustrating an example in which an active area of a resonator has a shape of an axisymmetric octagon and an aspect ratio of 1. FIG. 25 is a schematic plan view illustrating an example in which an active area of a resonator has an axisymmetric octagon and an aspect ratio of 1.5. FIG. 26 is a schematic plan view illustrating an example in which an active area of a resonator has a shape of an axisymmetric octagon and an aspect ratio of 2.0. FIG. 27 is a schematic plan view illustrating an example in which an active area of a resonator has a shape of an axisymmetric octagon and an aspect ratio of 2.5. FIG. 28 is a schematic plan view illustrating an example in which an active area of a resonator has a shape of an axisymmetric octagon and an aspect ratio of 3. FIG. 29 is a schematic plan view illustrating an example in which an active area of a resonator has a shape of an axisymmetric octagon and an aspect ratio of 3.5.

As illustrated in FIGS. 24 to 29, it can be seen that when an active area of the resonator has a shape of an octagon on an upper surface of the resonator (e.g. in a top plan view), a centroid of the octagon matches a center of a rectangle defining an aspect ratio of the octagon/active area.

As described above, even when an axisymmetric octagon has a relatively high aspect ratio, symmetry may be maintained to improve Q performance during resonance driving. In addition, in a high aspect ratio octagon is advantageous for improving spurious noise performance because an overlapping area of normal vectors on each side, such as upper and lower sides of the octagon, may be further reduced, it.

Figure 30:
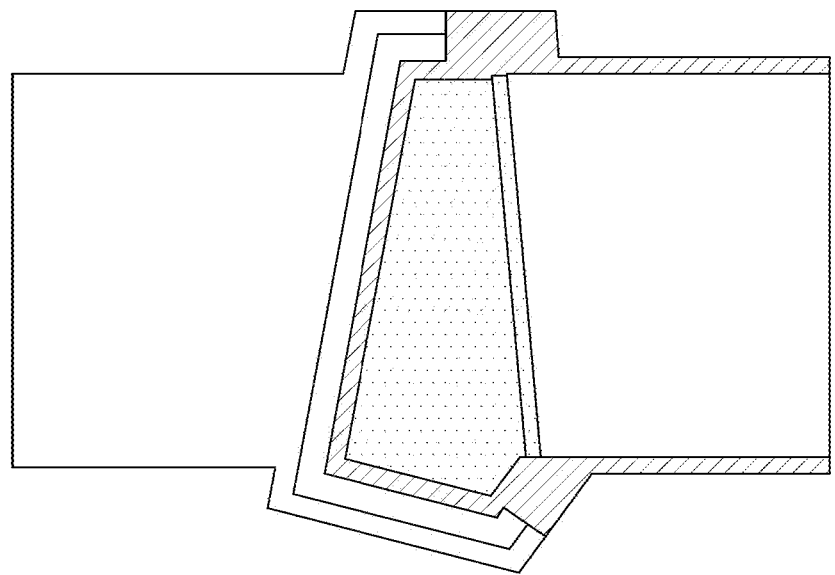
FIG. 30 is a schematic plan view illustrating an example in which an active area of a bulk-acoustic wave resonator has a shape of an asymmetric polygon and an aspect ratio of 2.4.
Figure 31:
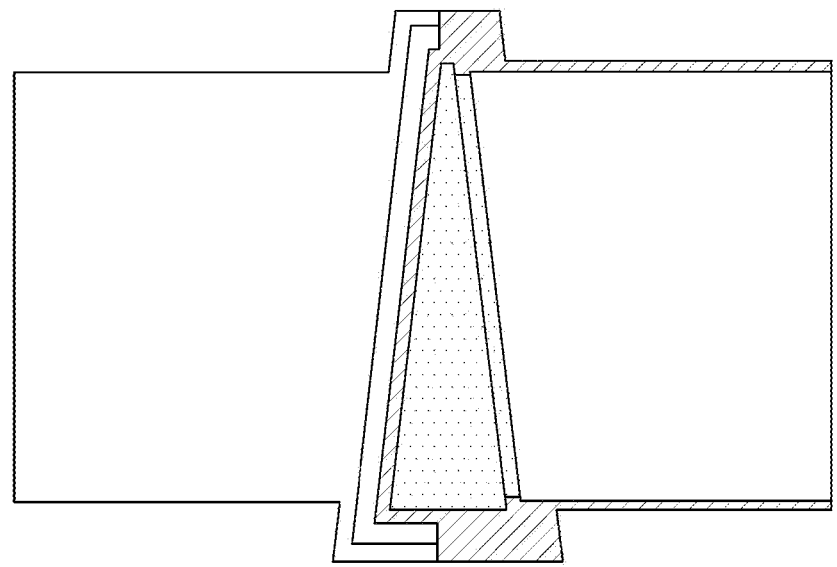
FIG. 31 is a schematic plan view illustrating an example in which an active area of a bulk-acoustic wave resonator has a shape of an asymmetric polygon and an aspect ratio of 3.8.
Figure 32:
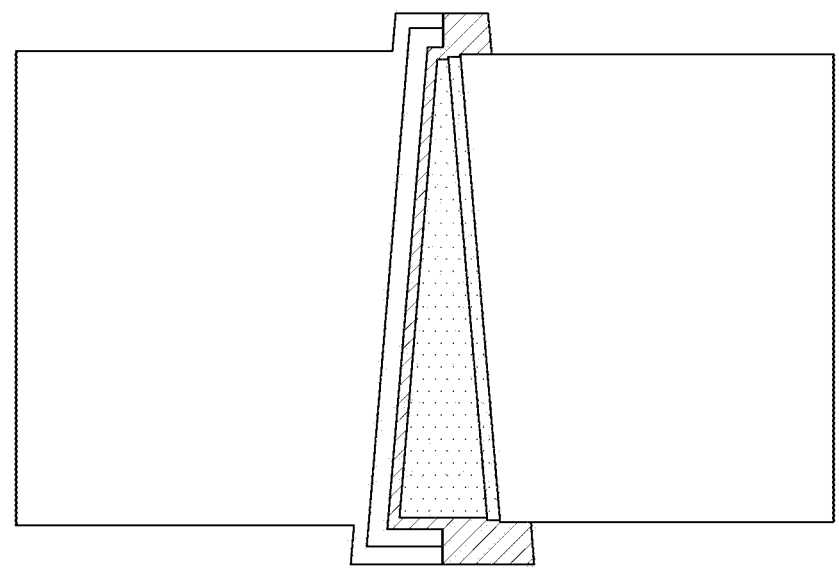
FIG. 32 is a schematic plan view illustrating an example in which an active area of a bulk-acoustic wave resonator has a shape of an asymmetric polygon and an aspect ratio of 5.1.
Figure 33:
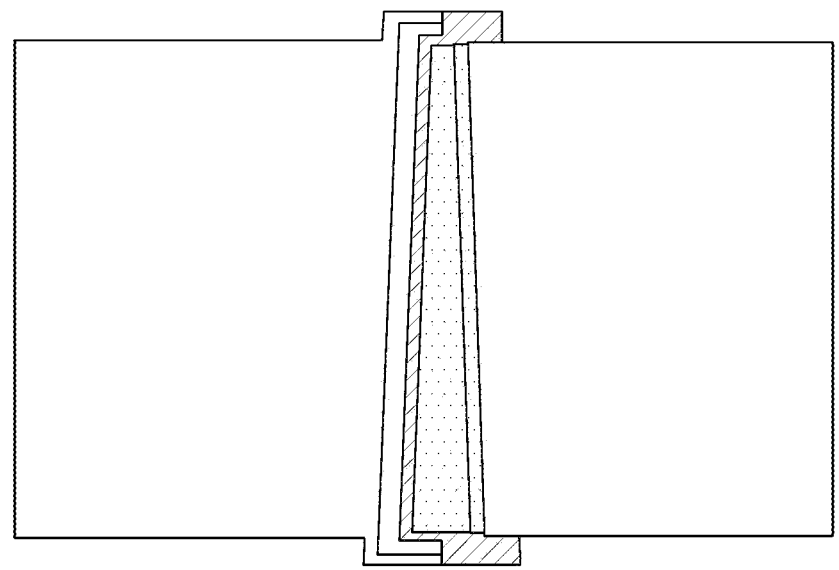
FIG. 33 is a schematic plan view illustrating an example in which an active area of a bulk-acoustic wave resonator has a shape of an asymmetric polygon and an aspect ratio of 12.4.

FIG. 30 is a schematic plan view illustrating an example in which an active area of a resonator has a shape of an asymmetric polygon and an aspect ratio of 2.4. FIG. 31 is a schematic plan view illustrating an example in which an active area of a resonator has a shape of an asymmetric polygon and an aspect ratio of 3.8. FIG. 32 is a schematic plan view illustrating an example in which an active area of a resonator has a shape of an asymmetric polygon and an aspect ratio of 5.1. FIG. 33 is a schematic plan view illustrating an example in which an active area of a resonator has a shape of an asymmetric polygon and an aspect ratio of 12.4.

Figure 34:
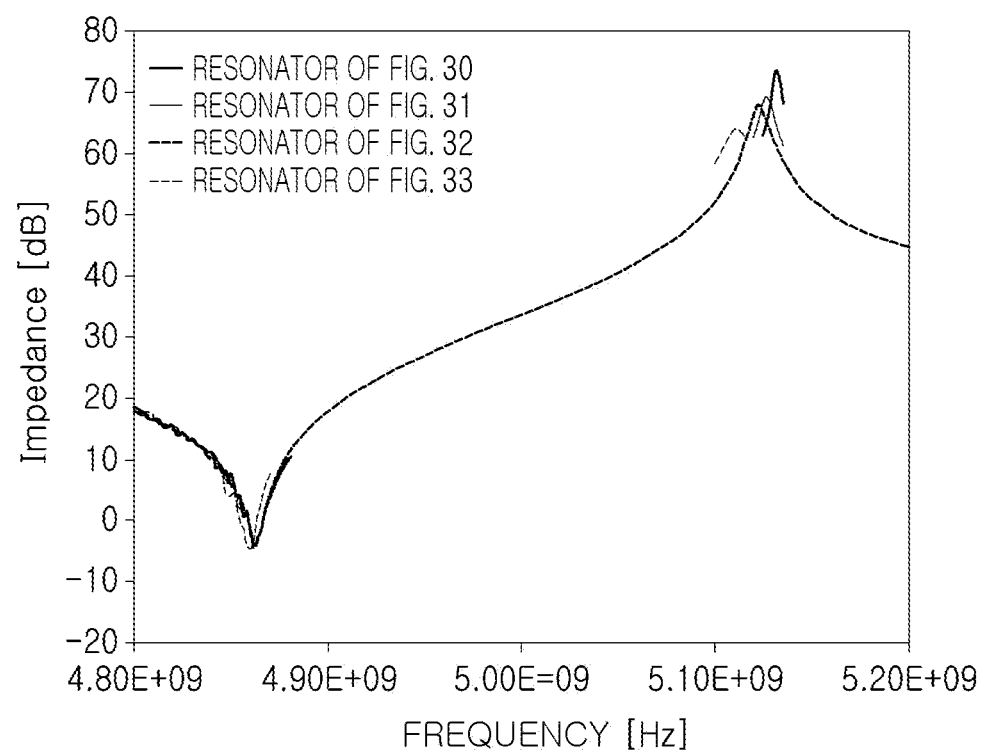
FIG. 34 is a graph illustrating impedance values depending on frequencies of the bulk-acoustic wave resonators illustrated in FIGS. 30 to 33, according to examples.
Figure 35:
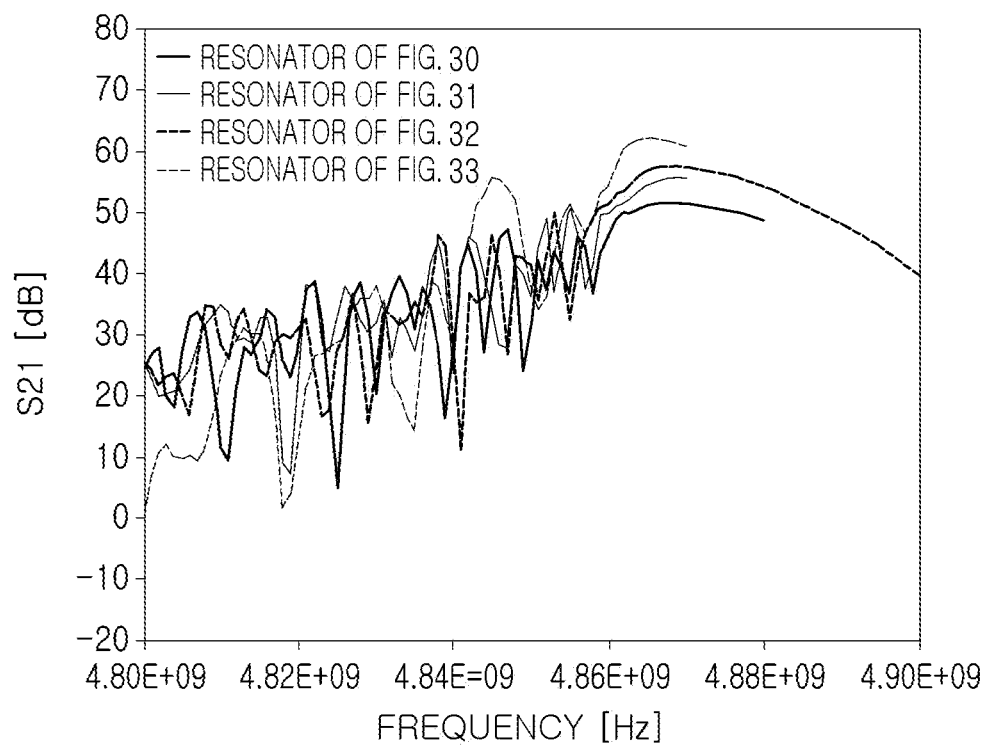
FIG. 35 is a graph of S21 depending on frequencies, illustrating spurious noise of the bulk-acoustic wave resonators illustrated in FIGS. 30 to 33, according to examples.

Examples of impedance values depending on frequencies of the resonators illustrated in FIGS. 30 to 33 can be seen in the graph illustrated in FIG. 34. Examples of spurious noise of the resonators illustrated in FIGS. 30 to 33 can be seen in the graph illustrated in FIG. 35. As illustrated in FIG. 35, it can be understood that the spurious noise is greatly deteriorated in the resonator illustrated in FIG. 33 having an aspect ratio of 10 or less.

As illustrated in Table 2 below, it can be understood that, as the aspect ratio increases, resistance loss at a resonance point may decrease to improve insertion loss, but $kt^2$ performance and attenuation performance may deteriorate.

TABLE 2

| AR | Included Angle (°) | fs (GHz) | fp (GHz) | $kt^2$ [%] | IL [dB] | Attn. [dB] |
|---|---|---|---|---|---|---|
| 2.4 | 13 | 4.8630 | 5.1310 | 12.24 | −0.057 | −30.6 |
| 3.8 | 13 | 4.8620 | 5.1250 | 12.04 | −0.052 | −28.8 |
| 5.1 | 9.5 | 4.8620 | 5.1210 | 11.87 | −0.045 | −27.2 |
| 12.4 | 2.7 | 4.8590 | 5.1100 | 11.55 | −0.037 | −24.4 |

Figure 36:
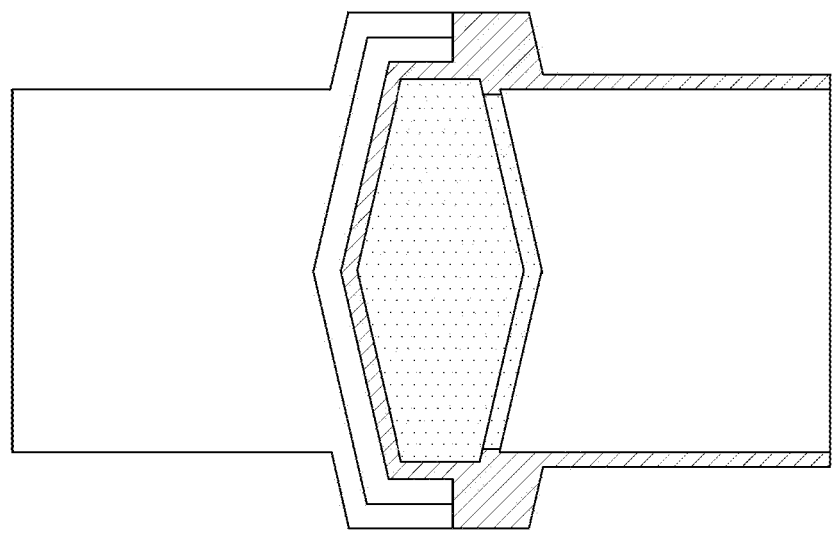
FIG. 36 is a schematic plan view illustrating an example in which an active area of a bulk-acoustic wave resonator has a shape of an axisymmetric polygon and an aspect ratio of 2.4.
Figure 37:
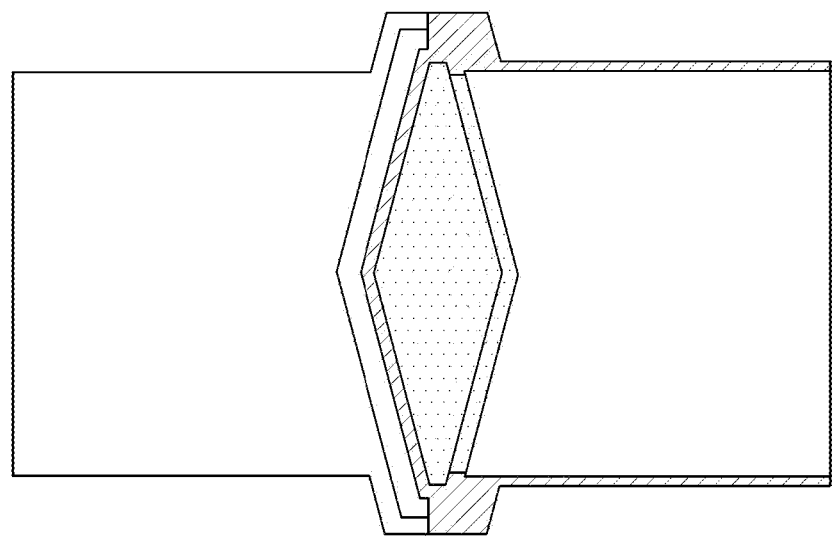
FIG. 37 is a schematic plan view illustrating an example in which an active area of a bulk-acoustic wave resonator has a shape of an axisymmetric polygon and an aspect ratio of 3.8.
Figure 38:
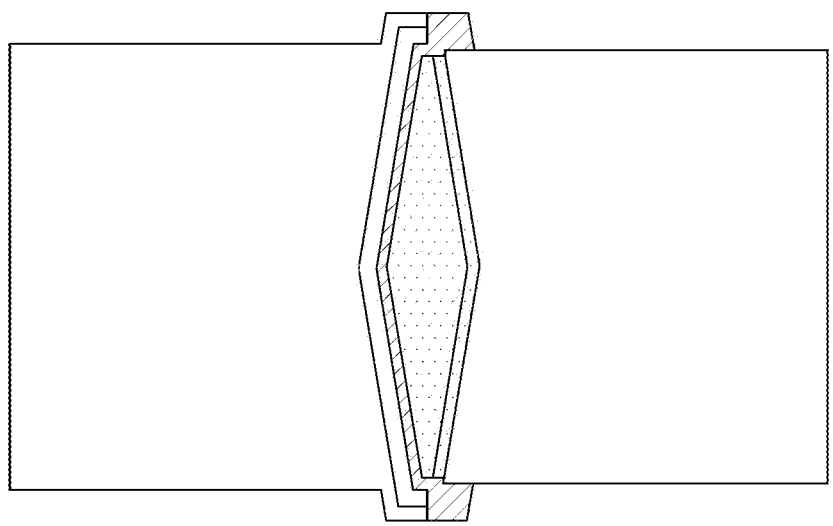
FIG. 38 is a schematic plan view illustrating an example in which an active area of a bulk-acoustic wave resonator has a shape of an axisymmetric polygon and an aspect ratio of 5.1.
Figure 39:
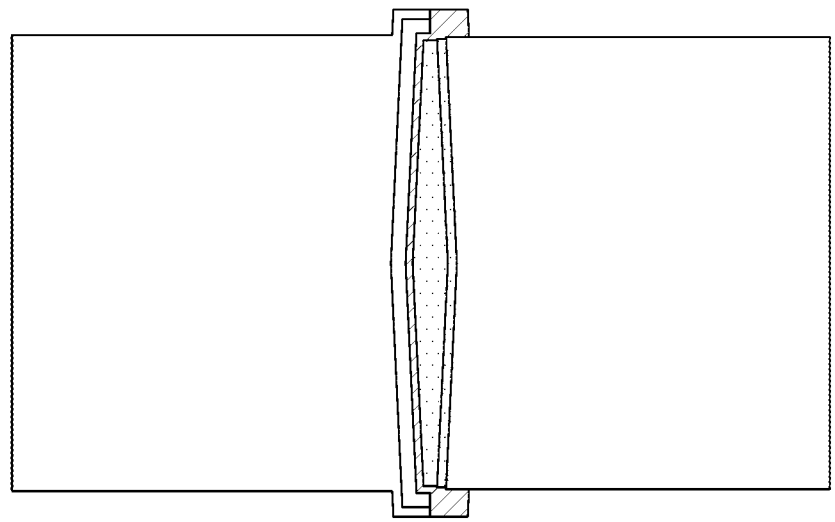
FIG. 39 is a schematic plan view illustrating an example in which an active area of a bulk-acoustic wave resonator has a shape of an axisymmetric polygon and an aspect ratio of 12.4.

FIG. 36 is a schematic plan view illustrating an example in which an active area of a resonator has a shape of an axisymmetric polygon and an aspect ratio of 2.4. FIG. 37 is a schematic plan view illustrating an example in which an active area of a resonator has a shape of an axisymmetric polygon and an aspect ratio of 3.8. FIG. 38 is a schematic plan view illustrating an example in which an active area of a resonator has a shape of an axisymmetric polygon and an aspect ratio of 5.1. FIG. 39 is a schematic plan view illustrating an example in which an active area of a resonator has a shape of an axisymmetric polygon and an aspect ratio of 12.4.

Figure 40:
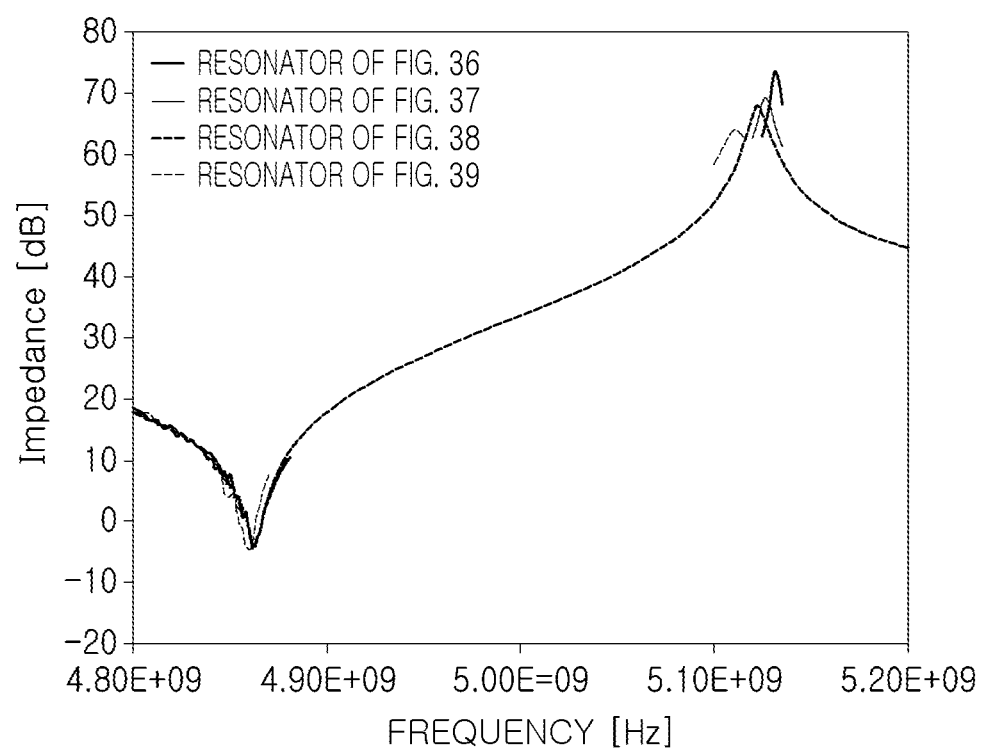
FIG. 40 is a graph illustrating impedance values depending on frequencies of the bulk-acoustic wave resonators illustrated in FIGS. 36 to 39, according to examples.
Figure 41:
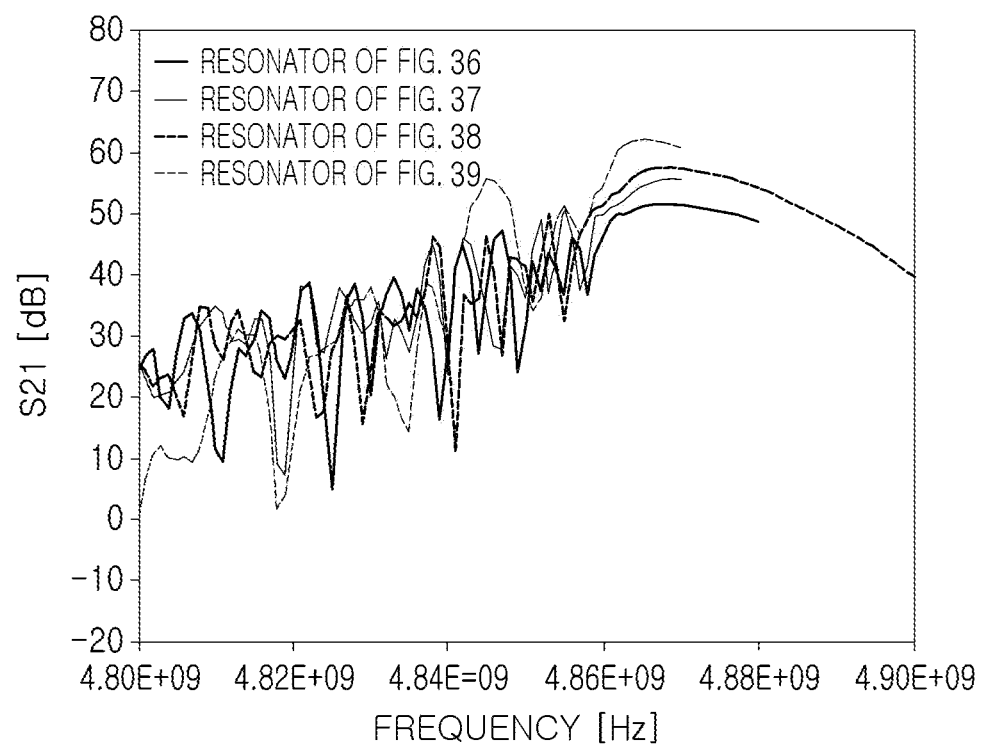
FIG. 41 is a graph of S21 depending on frequencies, illustrating spurious noise of the bulk-acoustic wave resonators illustrated in FIGS. 36 to 39, according to examples.

Example impedance values depending on frequencies of the resonators illustrated in FIGS. 36 to 39 can be seen in the graph illustrated in FIG. 40. Example spurious noise of the resonators illustrated in 36 to 39 can be seen in the graph illustrated in FIG. 41. As illustrated in FIG. 41, it can be understood that the spurious noise is greatly deteriorated in the resonator illustrated in FIG. 39 having an aspect ratio of 10 or less.

TABLE 3

| AR | Included Angle (°) | fs (GHz) | fp (GHz) | $kt^2$ [%] | IL [dB] | Attn. [dB] |
|---|---|---|---|---|---|---|
| 2.4 | 26 | 4.8630 | 5.1320 | 12.28 | −0.057 | −33.8 |
| 3.8 | 26 | 4.8620 | 5.1270 | 12.12 | −0.049 | −29.7 |
| 5.1 | 19 | 4.8620 | 5.1230 | 11.96 | −0.045 | −28.5 |
| 12.4 | 5.5 | 4.8590 | 5.1110 | 11.59 | −0.036 | −24.7 |

As illustrated in Table 3, it can be understood that insertion loss (IL), $kt^2$ performance, and spurious noise performance of the axisymmetric polygonal resonator are equal to or higher, compared to those of the asymmetric polygonal resonator of Table 2. For example, as illustrated in Table 3, it can be understood that attenuation performance of the axisymmetric polygonal resonator is improved, compared to that of the asymmetric polygonal resonator of Table 2.

The improved performance may be due to improvement in Q performance by smoother resonant driving of the axisymmetric polygonal resonator, in comparison to the asymmetrical polygonal resonator in the relatively high aspect ratio structure. In addition, as illustrated in Table 3, when an aspect ratio of the axisymmetric polygonal resonator is 12.4, spurious noise performance may be improved, in comparison to that of the asymmetrical polygonal resonator.

Figure 42:
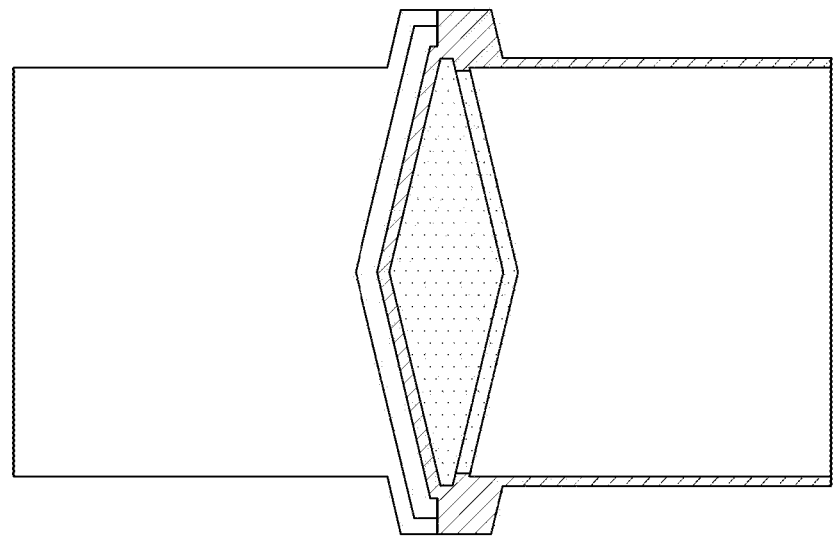
FIG. 42 is a schematic plan view illustrating an example in which an active area of a bulk-acoustic wave resonator has a shape of an axisymmetric polygon and an aspect ratio of 3.8.
Figure 43:
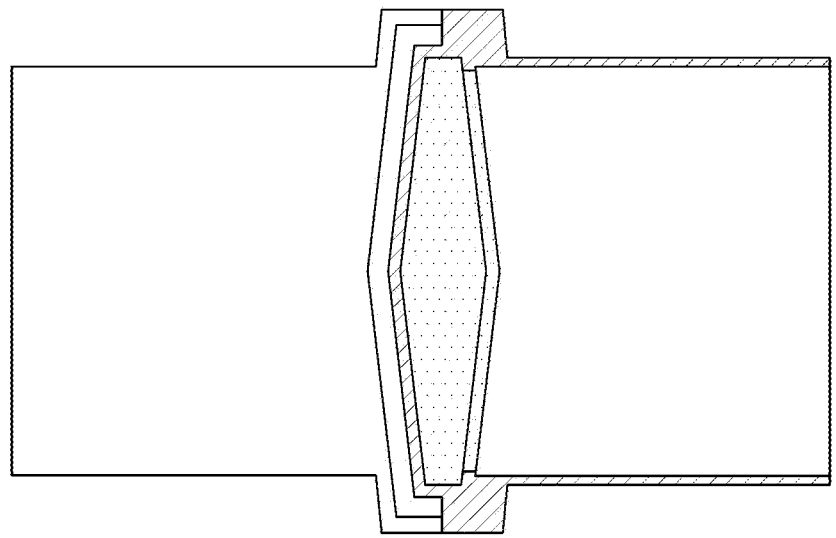
FIG. 43 is a schematic plan view illustrating an example in which an active area of a bulk-acoustic wave resonator has a shape of an axisymmetric polygon and an aspect ratio of 4.8.
Figure 44:
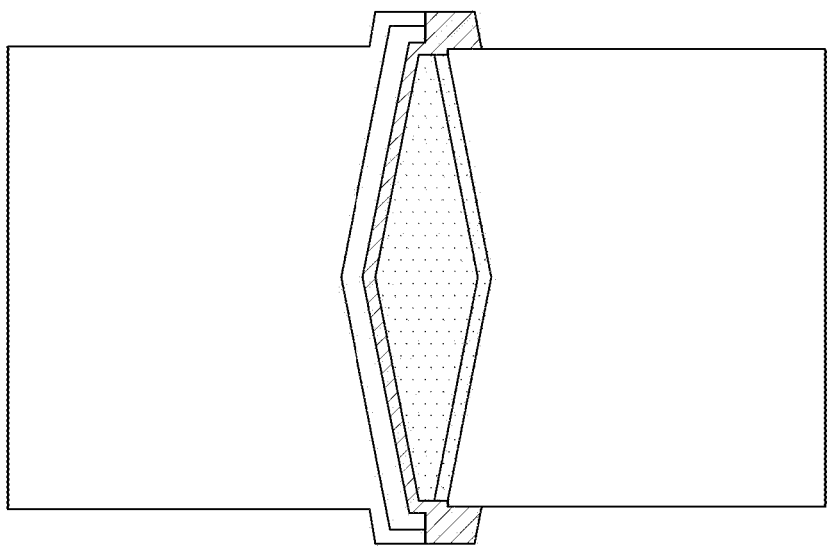
FIG. 44 is a schematic plan view illustrating an example in which an active area of a bulk-acoustic wave resonator has a shape of an axisymmetric polygon and an aspect ratio of 5.1.
Figure 45:
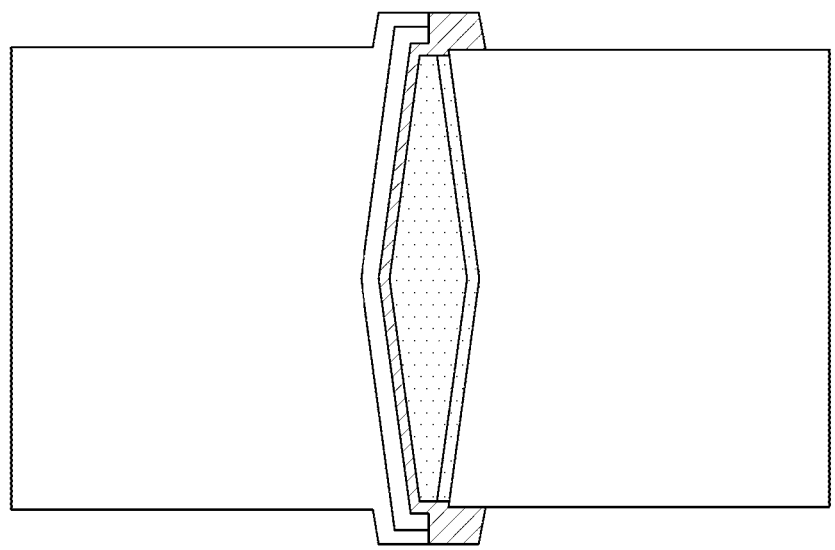
FIG. 45 is a schematic plan view illustrating an example in which an active area of a bulk-acoustic wave resonator has a shape of an axisymmetric polygon and an aspect ratio of 5.6.

FIG. 42 is a schematic plan view illustrating an example in which an active area of a resonator has a shape of an axisymmetric polygon and an aspect ratio of 3.8. FIG. 43 is a schematic plan view illustrating an example in which an active area of a resonator has a shape of an axisymmetric polygon and an aspect ratio of 4.8. FIG. 44 is a schematic plan view illustrating an example in which an active area of a resonator has a shape of an axisymmetric polygon and an aspect ratio of 5.1. FIG. 45 is a schematic plan view illustrating an example in which an active area of a resonator has a shape of an axisymmetric polygon and an aspect ratio of 5.6.

The resonator illustrated in FIG. 42 is an example in which an included angle θ is 26° and a length of one side is 130 μm, and the resonator illustrated in FIG. 43 is an example in which an included angle θ is 13° and a length of one side is 130 μm.

In addition, the resonator illustrated in FIG. 44 is an example in which an included angle θ is 19° and a length of one side is 150 μm, and the resonator illustrated in FIG. 45 is an example in which an included angle θ is 15° and a length of one side is 150 μm.

Figure 46:
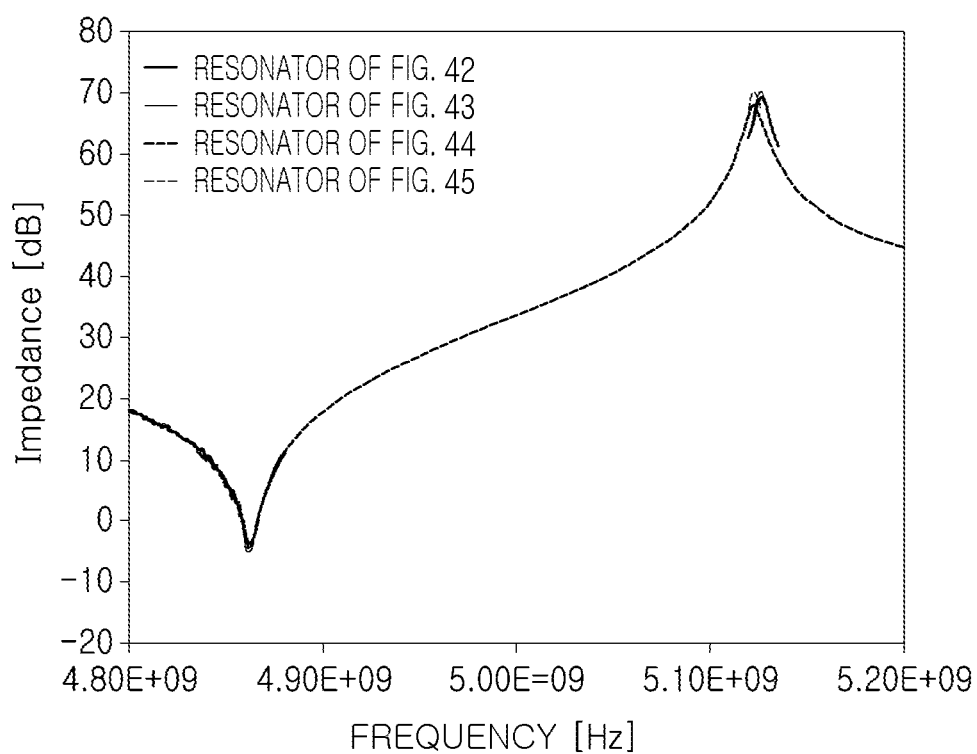
FIG. 46 is a graph illustrating impedance values depending on frequencies of the bulk-acoustic wave resonators illustrated in FIGS. 42 to 45, according to examples.

Example impedance values depending on frequencies of the resonators illustrated in FIGS. 42 to 45 can be seen in the graph illustrated in FIG. 46. Example spurious noise of the resonators illustrated in FIGS. 42 to 45 can be seen in the graph illustrated in FIG. 47.

Table 4 below shows example performance characteristics of the resonators of FIGS. 42 to 45.

TABLE 4

| AR | Included Angle (°) | fs (GHz) | fp (GHz) | kt² [%] | IL [dB] | Attn. [dB] |
|---|---|---|---|---|---|---|
| 3.8 | 26 | 4.8620 | 5.1270 | 12.12 | −0.049 | −29.7 |
| 4.8 | 13 | 4.8620 | 5.1260 | 12.08 | −0.042 | −30.5 |
| 5.1 | 19 | 4.8620 | 5.1230 | 11.96 | −0.045 | −28.5 |
| 5.6 | 15 | 4.8610 | 5.1230 | 12.00 | −0.043 | −30.5 |

Referring to Table 4, when performance of the resonator illustrated in FIG. 42 and performance of the resonator illustrated in FIG. 43 are compared, it can be understood that the resonator illustrated in FIG. 43 has improved insertion loss (IL) performance and attenuation performance. In addition, when performance of the resonator illustrated in FIG. 44 and performance of the resonator illustrated in FIG. 45 are compared, it can be understood that the resonator illustrated in FIG. 45 has improved insertion loss (IL) performance and attenuation performance.

Figures 47, 48:
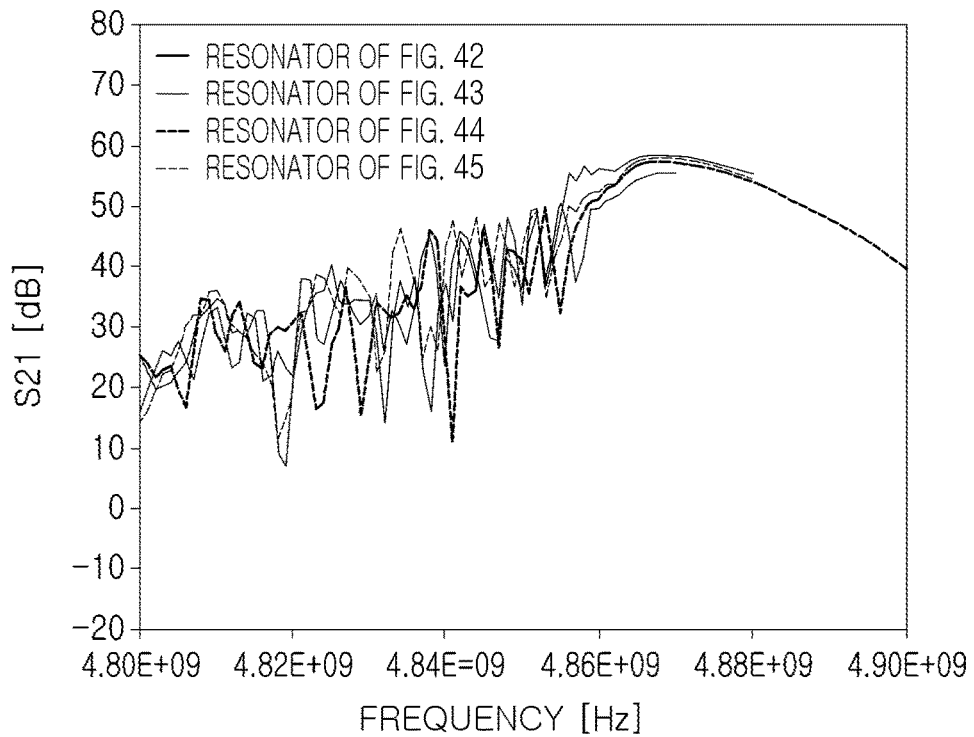
FIG. 47 is a graph of S21 depending on a frequency, illustrating spurious noise of the bulk-acoustic wave resonators illustrated in FIGS. 42 to 45, according to examples.
FIG. 48 is an example explanatory diagram illustrating a bulk-acoustic wave resonator in which an active area of the bulk-acoustic wave resonator has an X-axis symmetric polygon, and a centroid of the active area and a center of a rectangle defining an aspect ratio are spaced apart from each other in a Y-axis direction.
Figure 49:
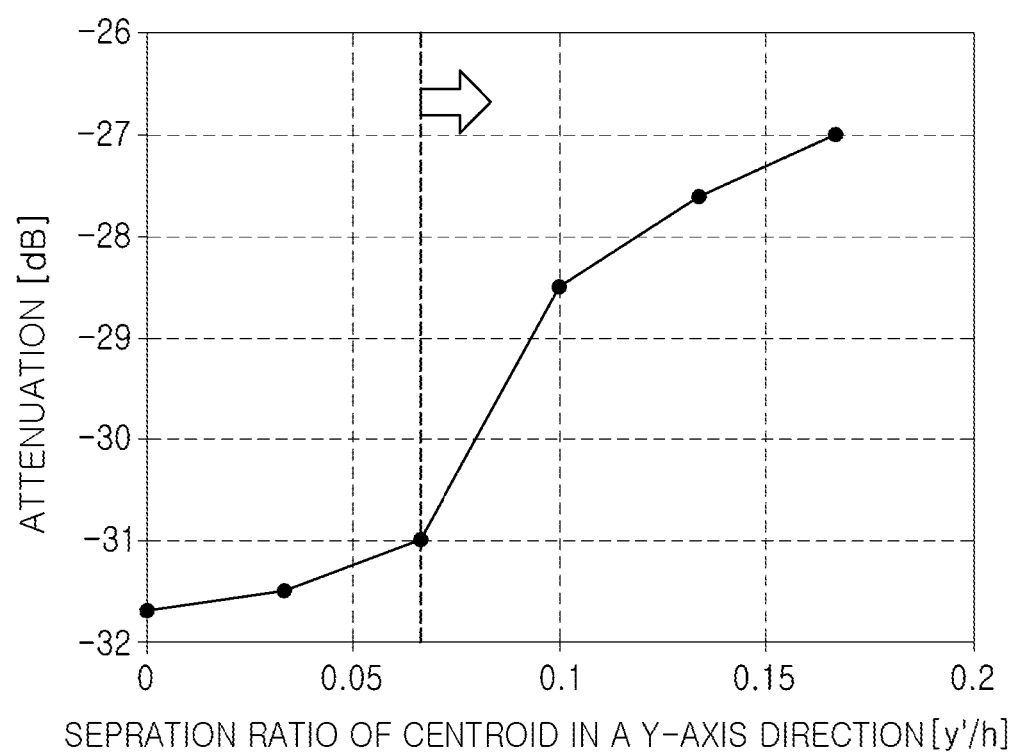
FIG. 49 is a graph illustrating attenuation performance depending on a separation ratio of a centroid of an active area, according to an example.

FIG. 48 is an example explanatory diagram illustrating a resonator in which an active area of the resonator has a shape of an X-axis symmetric polygon, and a centroid of the active area and a center of a rectangle defining an aspect ratio are spaced apart from each other in a Y-axis direction. FIG. 49 is a graph illustrating attenuation performance depending on a separation ratio of a centroid of an active area, according to an example.

As illustrated in FIG. 48, a centroid of the active area on an upper surface of the resonator (e.g., in a top plan view) mismatches a center of a rectangle defining an aspect ratio of the active area. It can be seen that coordinate values of an X-axis of the centroid of the active area may match coordinate values of an X-axis of the center of the rectangle defining the aspect ratio of the active area, and coordinate values of a Y-axis of the centroid of the active area may mismatch coordinate values of a Y-axis of the center of the rectangle defining the aspect ratio of the active area.

In addition, a bulk-acoustic wave resonator, according to an embodiment, may satisfy y'/h<0.067, where y' is a separation distance between the centroid of the active area and the center of the rectangle in a Y-axis direction, and h is a length of the active area in the Y-axis direction. For example, as illustrated in FIG. 49, it can be understood that, when a value of y'/h is greater than 0.067, attenuation performance may deteriorate rapidly. Further, it can be understood that, when a value of y'/h is less than 0.067, even in a case in which symmetry of the active area is slightly wrong, attenuation performance may not be significantly deteriorated.

Even when an active area has a relatively high aspect ratio, resistance loss and spurious noise performance at a resonance point may be improved, and Q performance may also be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
a substrate;
a lower electrode disposed on the substrate;
a piezoelectric layer at least partially covering the lower electrode;
an upper electrode at least partially covering the piezoelectric layer;
an etch-preventing portion; and
a sacrificial layer disposed outside of the etch-preventing portion,
wherein, on a surface of the bulk-acoustic wave resonator, a centroid of an active area in which the lower electrode, the piezoelectric layer, and the upper electrode all overlap each other is aligned with a center of a rectangle defining an aspect ratio of the active area,
wherein the active area has a shape of a polygon symmetrical with respect to at least one axis passing through the center of the rectangle defining the aspect ratio, and
wherein the aspect ratio is greater than or equal to 2 and less than or equal to 10.

2. The bulk-acoustic wave resonator according to claim 1, wherein the rectangle defining the aspect ratio is a rectangle having a largest aspect ratio among rectangles contacting three or more vertices of the polygon.

3. The bulk-acoustic wave resonator according to claim 1, wherein the polygon is a polygon having N angles, wherein N is an even number greater than or equal to 4.

4. The bulk-acoustic wave resonator according to claim 1, further comprising a membrane layer forming a cavity together with the substrate.

5. The bulk-acoustic wave resonator according to claim 4, wherein the etch-preventing portion is disposed to surround the cavity.

6. The bulk-acoustic wave resonator according to claim 1, further comprising an insertion layer at least partially disposed between the lower electrode and the piezoelectric layer.

7. The bulk-acoustic wave resonator according to claim 1, further comprising a passivation layer disposed to expose a portion of the lower electrode and a portion of the upper electrode.

8. The bulk-acoustic wave resonator according to claim 7, further comprising a metal pad contacting the exposed portion of the lower electrode and the exposed portion of the upper electrode.

9. A bulk-acoustic wave resonator, comprising:
a substrate;
a lower electrode disposed on the substrate;
a piezoelectric layer at least partially covering the lower electrode; and
an upper electrode at least partially covering the piezoelectric layer,
wherein a centroid of an active area in which the lower electrode, the piezoelectric layer, and the upper electrode all overlap each other matches a first axis coordinate value of a center of a rectangle defining an aspect ratio of the active area, and the centroid of the active area mismatches a second axis coordinate value of the center of the rectangle defining the aspect ratio of the active area, the first axis coordinate value being a coordinate value with respect to a first axis of the rectangle defining the aspect ratio, and the second axis coordinate value being a coordinate value with respect to a second axis of the rectangle defining the aspect ratio, and
wherein the bulk-acoustic wave resonator satisfies $y'/h<0.067$, $y'$ being a separation distance between the centroid of the active area and the center of the rectangle in a direction of the second axis, and h being a length of the active area in the direction of the second axis.

10. The bulk-acoustic wave resonator according to claim 9, wherein the active area is symmetrical with respect to the first axis.

11. The bulk-acoustic wave resonator according to claim 9, wherein the rectangle defining the aspect ratio is a rectangle having a largest aspect ratio among rectangles contacting three or more vertices of a perimeter shape of the active area.

12. The bulk-acoustic wave resonator according to claim 9, further comprising an insertion layer partially disposed between the lower electrode and the piezoelectric layer.

13. The bulk-acoustic wave resonator according to claim 12, wherein the insertion layer has a ring shape.

14. A bulk-acoustic wave resonator, comprising:
a lower electrode disposed on a substrate;
a piezoelectric layer disposed on the lower electrode; and
an upper electrode disposed on the piezoelectric layer,
wherein a perimeter of an active area in which the lower electrode, the piezoelectric layer, and the upper electrode all overlap each other has a shape of a polygon symmetrical with respect to at least one axis passing through a center of a rectangle defining an aspect ratio of the polygon,
wherein a centroid of the polygon is aligned with the center of the rectangle defining the aspect ratio, and
wherein the aspect ratio is greater than or equal to 2 and less than or equal to 10.

15. The bulk acoustic resonator of claim 14, wherein the at least one axis includes only one axis.

16. The bulk acoustic resonator of claim 14, wherein the polygon is either one of a rhombus, a hexagon, and an octagon.

17. The bulk-acoustic wave resonator of claim 14, wherein the aspect ratio is greater than or equal to 2.4 and less than or equal to 5.6.

18. The bulk-acoustic resonator of claim 14, wherein the rectangle defining the aspect ratio is a rectangle having a largest aspect ratio among rectangles contacting three or more vertices of the polygon.

19. A bulk-acoustic wave resonator, comprising:
a lower electrode disposed on a substrate;
a piezoelectric layer disposed on the lower electrode; and
an upper electrode disposed on the piezoelectric layer,
wherein an active area in which the lower electrode, the piezoelectric layer, and the upper electrode all overlap each other has a shape of a polygon,
wherein a centroid of the polygon matches a first axis coordinate value of a center of a rectangle defining an aspect ratio of the polygon, and the centroid of the active area mismatches a second axis coordinate value of the center of the rectangle defining the aspect ratio of the polygon, the first axis coordinate value being a coordinate value with respect to a first axis of the rectangle defining the aspect ratio, and the second axis coordinate value being a coordinate value with respect to a second axis of the rectangle defining the aspect ratio, and
wherein the bulk-acoustic wave resonator satisfies $y'/h<0.067$, $y'$ being a separation distance between the centroid of the active area and the center of the rectangle in a direction of the second axis, and h being a length of the active area in the direction of the second axis.

20. The bulk acoustic wave resonator of claim 19, wherein the active area is symmetrical with respect to the first axis.

21. The bulk acoustic wave resonator of claim 19, wherein the polygon is a hexagon.

* * * * *